(12) United States Patent
Hu et al.

(10) Patent No.: US 10,425,580 B2
(45) Date of Patent: Sep. 24, 2019

(54) IMAGE-CAPTURING DEVICE AND IMAGE-CAPTURING METHOD

(71) Applicant: TDK Taiwan Corp., Taipei (TW)

(72) Inventors: Chao Chang Hu, Taoyuan County (TW); Chih Wei Weng, Taoyuan County (TW)

(73) Assignee: TDK Taiwan, Corp., Taipei (TW)

( * ) Notice: Subject to any disclaimer, the term of this patent is extended or adjusted under 35 U.S.C. 154(b) by 93 days.

(21) Appl. No.: 15/390,666

(22) Filed: Dec. 26, 2016

(65) Prior Publication Data

US 2017/0195566 A1    Jul. 6, 2017

(30) Foreign Application Priority Data

Jan. 5, 2016   (TW) .............................. 105100179 A

(51) Int. Cl.
    *B41J 13/22*     (2006.01)
    *B41J 2/45*     (2006.01)
    *B41J 2/455*     (2006.01)
    *G02B 26/10*     (2006.01)
    *G02B 7/10*     (2006.01)
    (Continued)

(52) U.S. Cl.
CPC ....... *H04N 5/23238* (2013.01); *G02B 26/101* (2013.01); *H01L 21/0217* (2013.01); *H01L 21/02274* (2013.01); *H01L 21/283* (2013.01); *H01L 21/32135* (2013.01); *H01L 21/764* (2013.01); *H01L 29/0649* (2013.01); *H01L 29/42356* (2013.01); *H01L 29/4991* (2013.01); *H01L 29/6656* (2013.01); *H01L 29/66545* (2013.01); *H01L 29/66795* (2013.01); *H01L 29/785* (2013.01); *H04N 5/2254* (2013.01); *H04N 5/2259* (2013.01);
(Continued)

(58) Field of Classification Search
CPC ... G03B 5/06; G03B 5/02; G01C 3/08; G11B 7/1263; G01B 11/26; H04N 5/23287; H04N 5/23238; H04N 5/2254; G02B 7/10
See application file for complete search history.

(56) References Cited

U.S. PATENT DOCUMENTS 8,218,962 B2 *   7/2012   Fujii ...................... G03B 13/32
                                                  348/222.1
8,564,829 B2 *   10/2013   Muramatsu ............ H04N 1/387
                                                  348/208.12
(Continued)

*Primary Examiner* — Patricia I Young

(57) ABSTRACT

An image-capturing device uses a light reflecting member to redirect an exterior light image toward a lens module in order to focus the light image onto an image-capturing unit. The image-capturing device includes a rotating unit for driving the light-reflecting member to rotate within a limited range in such a manner that the image-capturing device can capture at least two light images of different photo-ing areas and combine them into one single combined image without a need of moving the image-capturing unit and the lens module. When a user takes a panoramic or wide-ranged picture, he/she doesn't need to move the whole image-capturing device, but only needs to stand at the same position, faces the same direction and simply pushes the shutter button, and then the image-capturing device will automatically capture light images of different photo-ing areas and then integrate them into one single panoramic or wide-ranged picture.

4 Claims, 19 Drawing Sheets

(51) Int. Cl.
*H04N 5/232* (2006.01)
*H01L 29/49* (2006.01)
*H04N 5/225* (2006.01)
*H01L 21/02* (2006.01)
*H01L 21/283* (2006.01)
*H01L 21/3213* (2006.01)
*H01L 21/764* (2006.01)
*H01L 29/06* (2006.01)
*H01L 29/423* (2006.01)
*H01L 29/66* (2006.01)
*H01L 29/78* (2006.01)

(52) U.S. Cl.
CPC ..... *H04N 5/23254* (2013.01); *H04N 5/23258* (2013.01); *H04N 5/23287* (2013.01)

(56) References Cited

U.S. PATENT DOCUMENTS

| | | | |
|---|---|---|---|
| 2006/0098552 A1* | 5/2006 | Kawamura | G11B 7/1263 369/112.01 |
| 2009/0251680 A1* | 10/2009 | Farsaie | G01C 3/08 356/3 |
| 2010/0174507 A1* | 7/2010 | Vogel | G01B 11/26 702/151 |

* cited by examiner

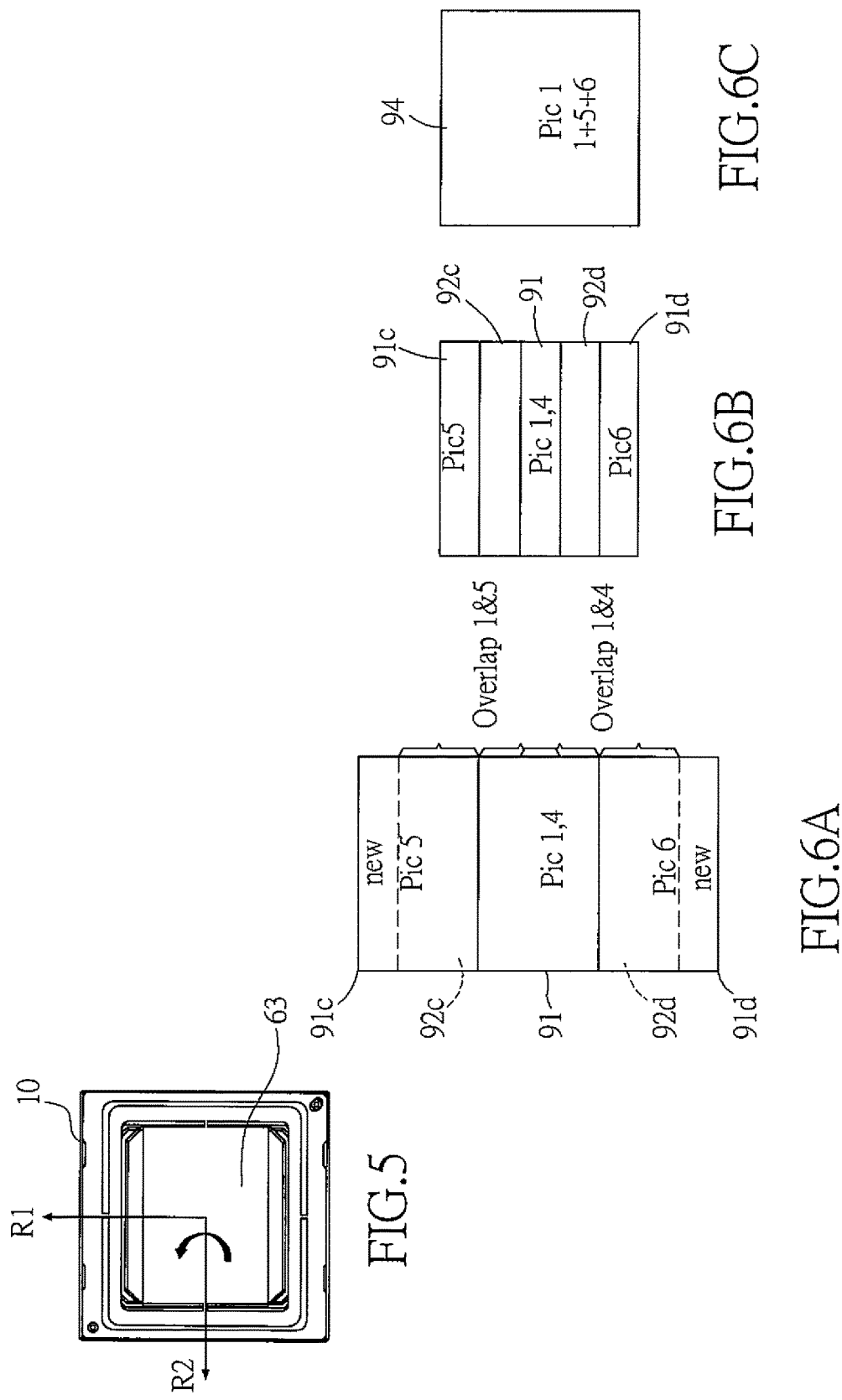

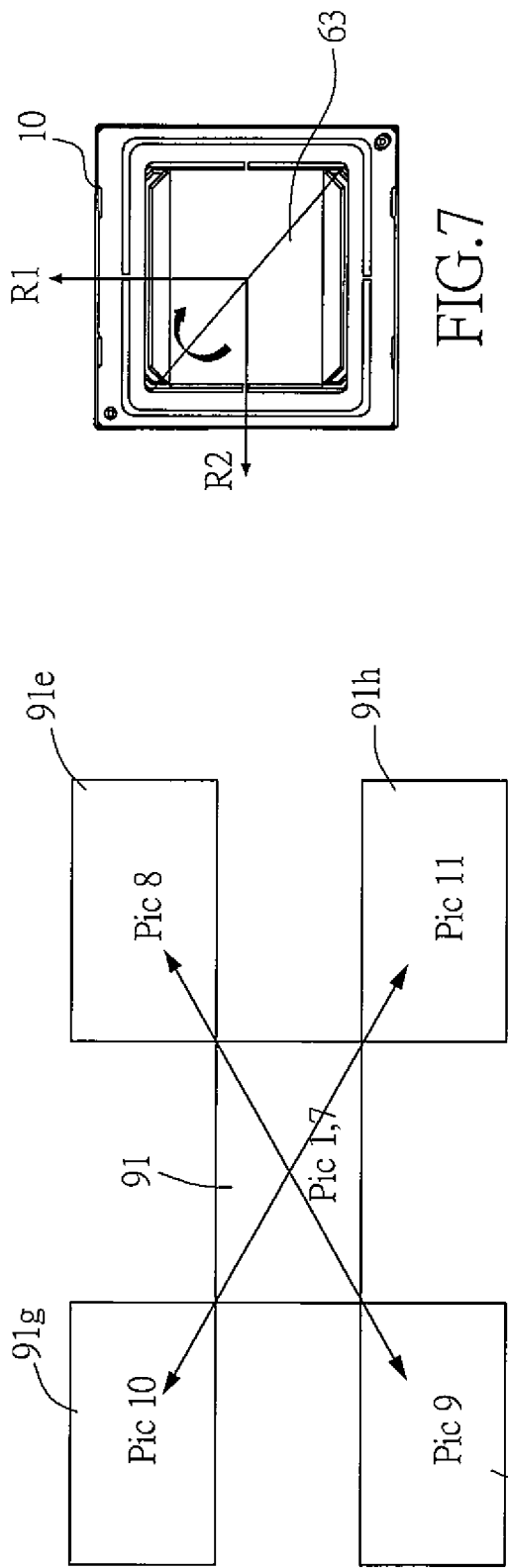

IMAGE-CAPTURING DEVICE AND IMAGE-CAPTURING METHOD

This application claims the benefit of Taiwan Patent Application Serial No. 105100170, filed Jan. 5, 2016, the subject matter of which is incorporated herein by reference.

BACKGROUND OF INVENTION

1. Field of the Invention

The invention relates to an image-capturing system, and more particularly to an image-capturing device and an image-capturing method that applies a rotating unit to drive a light-reflecting member to undergo a limited pivotal motion, so as to capture at least two exterior light images for being integrated into a single combined image without shifting an image-capturing unit and a lens module.

2. Description of the Prior Art

In the art, when an optical image-capturing device (such as, but not limited to, a digital camera, a video recorder, a smart phone with photo-capturing functions and the like) is applied to capture panoramic or wide-ranged pictures, the user usually needs to hand hold the whole optical image-capturing device firmly and circle around by having his/her own body as the center for circling and photo-capturing. While he/she rotates, a series of photos can be produced by the optical image-capturing device. Then, these in-series photos can be integrated to form a combined photo with panoramic or wide-ranged visions. Obviously, the aforesaid manner to obtain a panoramic or wide-ranged picture by rotating the human body as well as the optical image-capturing device is cumbersome and has a stability problem. Generally, the resulted panoramic or wide-ranged picture meets a quality problem. Though there is already in the marketplace an auto-rotating platform useful for the optical image-capturing device to capture serial photos for further producing a panoramic or wide-ranged picture with better and stable quality, yet the auto-rotating platform is anyway an additional expense and may cause a notorious problem in portability. Further, all the aforesaid techniques for obtaining the panoramic or wide-ranged picture require the whole optical image-capturing device to rotate for photo capturing. Such a rotating operation implies that the internal lens set and imaging sensors of the optical image-capturing device shall be synchronously rotated simultaneously so as able to capture meaningful images with different photo-ing areas for an expected combined picture. Definitely, the inconvenience is obvious, and a further improvement thereupon is necessary.

SUMMARY OF THE INVENTION

Accordingly, it is the primary object of the present invention to provide an image-capturing device and an image-capturing method that can apply a rotating unit to drive a light-reflecting member to undergo a limited pivotal motion, such that at least two exterior light images for being integrated into a single combined image without shifting an image-capturing unit and a lens module can be obtained.

In the present invention, the image-capturing method is applicable to an image-capturing device. The image-capturing device comprises:

a light-reflecting member for redirecting a light image in a foreign photo-ing area to an optical path;

an image-capturing unit, located on the optical path to receive the light image and further to transform the light image into a corresponding electric signal readable to a control unit;

a lens module, located on the optical path at a position between the light-reflecting member and the image-capturing unit, being to image the light image from the light-reflecting member onto the image-capturing unit;

a rotating unit, engaged with the light-reflecting member to drive the light-reflecting member to undergo a limited pivotal motion about at least an axial direction and so as to allow at least two foreign light images at different photo-ing areas to be redirected to the optical path 60 by the light-reflecting member and then imaged onto the image-capturing unit, such thon the image-capturing unit is able to capture the at least two foreign light images in the different photo-ing areas without moving the image-capturing unit and the lens module; and the control unit, electrically coupled with the image-capturing unit and the rotating unit, being to control the rotating unit and the image-capturing unit and to integrate the at least two light images imaged on the image-capturing unit to further produce a combined image.

The image-capturing method comprises:

Step A: the control unit controlling the rotating unit to drive the light-reflecting member to rotate to a first position about the first axial direction and to control the image-capturing unit to capture a first light image;

Step B: without moving the image-capturing unit and the lens module, the control unit controlling the rotating unit to drive the light-reflecting member to rotate to a second position about the first axial direction and to control the image-capturing unit to capture a second light image; wherein the first light image and the second light image are partly overlapped to have a duplicated image; and Step C: the control unit basing on the duplicated image of the first light image and the second light image to integrate the first light image and the second light image into a single combined image; wherein the first light image and the second light image have the same length, width and pixel value, and at least one of the length, width and pixel value of the combined image is larger than that of the first light image.

In one embodiment of the present invention, the light-reflecting member is disposed at a twin-axial rotating element, the twin-axial rotating element is able to undergo the limited pivotal motion at least about a first axial direction and a second axial direction perpendicular to the first axial direction, and the rotating unit connected with the twin-axial rotating element is to drive the twin-axial rotating element to undergo the limited pivotal motion about the first axial direction and the second axial direction.

In one embodiment of the present invention, when the control unit controls the rotating unit to drive the twin-axial rotating element to undergo the limited pivotal motion through at least a first position, a second position and a third position thereof about the first axial direction, the control unit controls simultaneously the image-capturing unit to capture a first light image, a second light image and a third light image corresponding to the first position, the second position and the third position of the twin-axial rotating element, respectively;

the first light image is an image formed on the image-capturing unit corresponding to a foreign light image in the first photo-ing area while the twin-axial rotating element is at the first position, the second light image is an image formed on the image-capturing unit corresponding to a foreign light image in the second photo-ing area while the twin-axial rotating element is at the second position, and the third light image is an image formed on the image-capturing unit corresponding to a foreign light image in the third photo-ing area while the twin-axial rotating element is at the third position; and, the first photo-ing area and the second photo-ing area are partly overlapped so that a duplicated image is formed partly to the first light image and the second light image, the first photo-ing area and the third photo-ing area are also partly overlapped so that another duplicated image is formed partly to the first light image and the third light image, and the control unit bases on the two duplicated images among the first light image, the second light image and the third light image to integrate and produce the single combined image.

In one embodiment of the present invention, when the control unit controls the rotating unit to drive the twin-axial rotating element to undergo the limited pivotal motion through at least a fourth position, a fifth position and a sixth position thereof about the second axial direction, the control unit controls simultaneously the image-capturing unit to capture a fourth light image, a fifth light image and a sixth light image corresponding to the fourth position, the fifth position and the sixth position of the twin-axial rotating element, respectively;

the fourth light image is an image formed on the image-capturing unit corresponding to a foreign light image in the fourth photo-ing area while the twin-axial rotating element is at the fourth position, the fifth light image is an image formed on the image-capturing unit corresponding to a foreign light image in the fifth photo-ing area while the twin-axial rotating element is at the fifth position, and the sixth light image is an image formed on the image-capturing unit corresponding to a foreign light image in the sixth photo-ing area while the twin-axial rotating element is at the sixth position;

the fourth photo-ing area and the fifth photo-ing area are partly overlapped so that a duplicated image is formed partly to the fourth light image and the fifth light image, the fourth photo-ing area and the sixth photo-ing area are also partly overlapped so that another duplicated image is formed partly to the fourth light image and the sixth light image, and the control unit bases on the two duplicated images among the fourth light image, the fifth light image and the sixth light image to integrate and produce the single combined image; and, the fourth light image, the fifth light image and the sixth light image have the same length, width and pixel value, and at least one of the length, width and pixel value of the combined image is larger than that of the fourth light image.

In one embodiment of the present invention, when the control unit controls the rotating unit to drive the twin-axial rotating element to undergo a twin-axial pivotal motion through at least a seventh position, an eighth position, a ninth position, a tenth position and an eleventh position thereof about the first axial direction and the second axial direction, the control unit controls simultaneously the image-capturing unit to capture a seventh light image, an eighth light image, a ninth light image, a tenth light image and an eleventh light image corresponding to the seventh position, the eighth position, the ninth position, the tenth position and the eleventh position of the twin-axial rotating element, respectively, the eighth, ninth, tenth and eleventh light images are individually partly overlapped with the seventh light image, and the control unit bases on duplicated images among the seventh, eighth, ninth, tenth and eleventh light images to integrate the single combined image; wherein the seventh, eighth, ninth, tenth and eleventh light images all have the same length, width and pixel value, and the length, width and pixel value of the combined image are all larger than those of the seventh light image.

In one embodiment of the present invention, the image-capturing device further includes a switch mechanism engaged with the rotating unit, wherein the switch mechanism drives the rotating unit to rotate about a third axial direction so as to drive simultaneously the rotating unit associated with the light-reflecting member to undergo a rotation about the third axial direction; wherein the first axial direction is perpendicular to the second axial direction, the second axial direction is perpendicular to the third axial direction, and the first axial direction intersects the third axial direction by a 45-degree angle.

In one embodiment of the present invention, the twin-axial rotating element is formed as a thin spring plate including an outer frame portion, a middle frame portion and an inner plate portion; the inner plate portion having a plane facing the optical path, the first axial direction and the second axial direction being defined on this plane; the middle frame portion circling around a periphery of the inner plate portion, at least one first through trench being formed between the middle frame portion and the inner plate portion for separating the middle frame portion and the inner plate portion, two first connection ribs aligned in the first axial direction being provided between the middle frame portion and the inner plate portion for connecting the middle frame portion and the inner plate portion; the outer frame portion circling around a periphery of the middle frame portion, at least one second through trench being formed between the outer frame portion and the middle frame portion for separating the outer frame portion and the middle frame portion, two second connection ribs aligned in the second axial direction being provided between the outer frame portion and the middle frame portion for connecting the outer frame portion and the middle frame portion .

In one embodiment of the present invention, the rotating unit is an electromagnetic driving module including at least an inner carrier structure, an outer carrier structure, at least one first magnet, at least one second magnet, at least one first coil and at least one second coil;

the inner carrier structure is engaged on a bottom of the inner plate portion so as to co-move with the inner plate portion, and the outer carrier structure is fixed with a bottom of the outer frame portion;

one of the first magnet and the first coil is mounted at the inner carrier structure while another thereof is mounted at the outer carrier structure, the first coil being energized to produce a corresponding electromagnetic force to push the first magnet and the inner plate portion on the inner carrier structure to undergo the pivotal motion about the first axial direction;

one of the second magnet and the second coil is mounted at the inner carrier structure while another thereof is mounted at the outer carrier structure, the second coil being energized to produce a corresponding electromagnetic force to push the second magnet and the inner plate portion on the inner carrier structure to undergo the pivotal motion about the second axial direction;

t the inner carrier structure is a wedge-shape frame structure having a rectangular first contact portion connecting the inner plate portion and four first side surfaces extending from corresponding lateral sides of the rectangular first contact portion in respective directions away of the inner plate portion, two of these four first side surfaces being shaped to two right triangles standing on opposing lateral sides of the rectangular first contact portion in a parallel manner, another two of the four first side surfaces being shaped to two rectangles standing on another two opposing lateral sides of the rectangular first contact portion in a manner of connecting at top sides thereof in a right angle, each of the first side surfaces having an individual first accommodation base;

the outer carrier structure is a wedge-shape frame structure having a rectangular second contact portion connecting the outer frame portion and four second side surfaces extending from corresponding lateral sides of the rectangular second contact portion in respective directions away of the outer frame portion, two of these four second side surfaces being shaped to two right triangles standing on opposing lateral sides of the rectangular second contact portion in a parallel manner, another two of the four second side surfaces being shaped to two rectangles standing on another two opposing lateral sides of the rectangular second contact portion in a manner of connecting at top sides thereof in a right angle, each of the second side surfaces having an individual second accommodation base;

the first magnet is mounted into the first accommodation base of the triangular first side surface of the inner carrier structure, and the first coil is mounted into the second accommodation base of the triangular second lateral side surface of the outer carrier structure via a first circuit board; and, the second magnet is mounted into the first accommodation base of the rectangular first side surface of the inner carrier structure, and the second coil is mounted into the second accommodation base of the rectangular second lateral side of the outer carrier structure via a second circuit board.

All these objects are achieved by the image-capturing device and the image-capturing method described below.

BRIEF DESCRIPTION OF THE DRAWINGS

The present invention will now be specified with reference to its preferred embodiment illustrated in the drawings, in which:

FIG. 5 demonstrates schematically a limited pivotal motion of the light-reflecting member driven by the twin-axial rotating element of the image-capturing device in accordance with the present invention, clockwise or counter clockwise about the second axial direction (R2);

FIG. 6A shows three consecutive light images captured by image-capturing unit of the image-capturing device in accordance with the present invention, in which these three light images are captured at different photo-ing areas by rotating the light-reflecting member to three corresponding positions during the pivotal motion of FIG. 5;

FIG. 6B shows a schematic view of overlapping the three light images of FIG. 6A;

FIG. 6C shows schematically a single combined image after the overlapping of FIG. 6B;

FIG. 7 demonstrates schematically a limited twin-axial pivotal motion of the light-reflecting member driven by the twin-axial rotating element of the image-capturing device in accordance with the present invention, clockwise or counter clockwise about a twin-axial direction made up by the first axial direction (R1) and the second axial direction (R2);

FIG. 8A shows five consecutive light images captured by image-capturing unit of the image-capturing device in accordance with the present invention, in which these five light images are captured at different photo-ing areas by rotating the light-reflecting member to five corresponding positions;

FIG. 8B shows schematically a single combined image after integrating the five light images of FIG. 8A;

DESCRIPTION OF THE PREFERRED EMBODIMENT

The invention disclosed herein is directed to an image-capturing device and an image-capturing method. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

In the present invention, the image-capturing device and the image-capturing method are mainly to apply a light-reflecting member to redirect a foreign light image in a photo-ing area to an optical path and then to apply a lens module on the optical path to image the light image onto an image-capturing unit. In addition, a rotating unit is particularly applied to drive the light-reflecting member to undergo limited pivotal motions so as allow the image-capturing unit and the lens module to capture, without any shifting, at least two foreign light images in different photo-ing areas for further being integrated into a single combined image. Hence, when a user applies the image-capturing device of the present invention to capture a panoramic or wide-ranged picture, no displacement or rotation shall be imposed on the whole optical image-capturing device. Actually, he/she needs simply to hold his/her current position, to face the same direction, and to push the shutter button, then the image-capturing device of the present invention would automatically capture a plurality of foreign light images in different photo-ing areas so as further to integrate or overlap these light images into form a single combined image, such that the wide-ranged or panoramic picture can be obtained.

Figure 1:
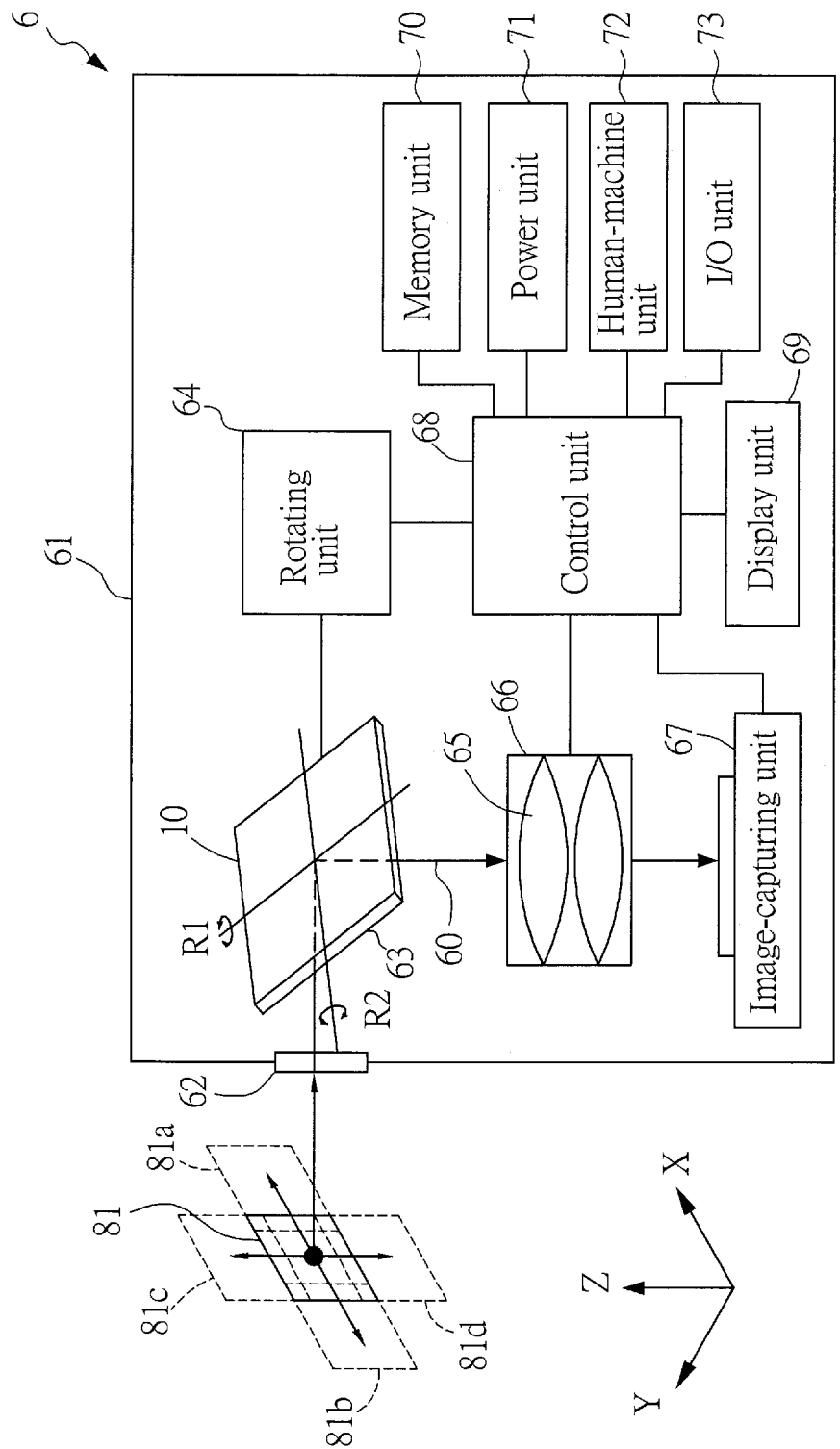
FIG. 1 is a schematic block view of a preferred image-capturing device in accordance with the present invention.
Figure 2:
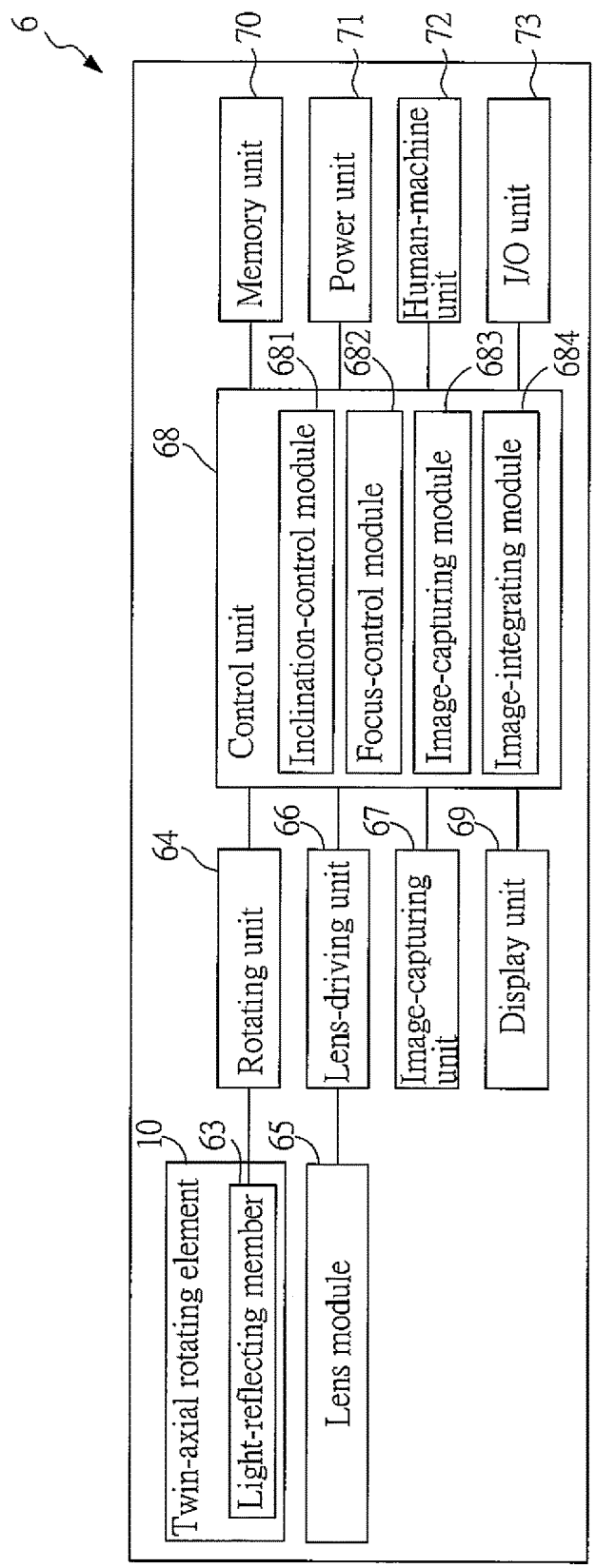
FIG. 2 is another schematic block view of the control unit of FIG. 1.

Refer now to FIG. 1 and FIG. 2; where FIG. 1 is a schematic block view of a preferred image-capturing device in accordance with the present invention, and FIG. 2 is another schematic block view of the control unit of FIG. 1.

In the present invention, the image-capturing device 6 can be a digital camera, a video recorder, a smart phone with image-capturing modules, a tablet computer, a notebook computer or the like portable electronic device. The image-capturing device 6 includes a housing 61, at least a light-introducing window 62, a light-reflecting member 63, a rotating unit 64, a lens module 65, a lens-driving unit 66, an image-capturing unit 67, a control unit 68, a display unit 69, a memory unit 70, a power unit 71, a human-machine unit 72, and an I/O unit 73. In the embodiment shown in FIG. 1 and FIG. 1, the rotating unit 64, the lens-driving unit 66, the image-capturing unit 67, the display unit 69, the memory unit 70, the power unit 71, the human-machine unit 72, and the I/O unit 73 are all electrically coupled with the control unit 68.

The aforesaid elements of the image-capturing device 6 are accommodated inside the housing 61. On the housing 61, at least one light-introducing window 62 is constructed so as to allow foreign light images to enter therethrough the housing 61. The light-reflecting member 63 is disposed at a place corresponding to the light-introducing window 62, so that a light image from a foreign photo-ing area 81 can penetrate the light-introducing window 62 and then reach the light-reflecting member 63. The light image is then redirected to a optical path 60 by the light-reflecting member 63. In this embodiment, the light-reflecting member 63 can be a mirror or a prism. The lens module 65 is consisted of at least one optical lens. The image-capturing unit 67 includes image sensors and related circuits.

The lens module 65 and the image-capturing unit 67 are both located on the optical path 60, and particularly the lens module 65 is disposed between the light-reflecting member 63 and the image-capturing unit 67. More precisely, the optical path 60 is defined by the lens module 65, such that the redirected light image from the light-reflecting member 63 can be focused at the lens module 65 and then imaged on a light-receiving surface of the image-capturing unit 67. The image-capturing unit 67 receives the light image and then transforms the light image into an electric signal readable for the control unit 68.

The rotating unit 64 is engaged with the light-reflecting member 63 to drive the light-reflecting member 63 to undergo a limited pivotal motion about a predetermined axial direction selected from the group of the axial directions defined in this disclosure. Thereupon, at least two foreign light images at different photo-ing areas (81, 81a, 81b, 81c and 81d for example) can be redirected to the optical path 60 by the light-reflecting member 63 and then imaged onto the image-capturing unit 67. Thus, in the present invention, the image-capturing unit 67 can capture at least two foreign light images at different photo-ing areas 81, 81a, 81b, 81c and 81d without any displacement and rotation on the image-capturing unit 67, the lens module 65 and even the whole image-capturing device 6. Since the control unit 68 is electrically coupled with and thus controls the image-capturing unit 67 and the rotating unit 64, so the control unit 68 would perform an image-integrating operation upon the at least two light images captured by the image-capturing unit 67 so as to produce a combined image of the the at least two light images.

In this embodiment, the light-reflecting member 63 is mounted on the twin-axial rotating element 10 in an 45-degree inclination angle at a position between the light-introducing window 62 and the lens module 65, such that the light image enters horizontally the housing 61 through the light-introducing window 62 can be redirected downward to enter the lens module 65 by the light-reflecting member 63. The twin-axial rotating element 10 of the present invention can perform limited pivotal motions at least about a first axial direction (R1) and a second axial direction (R2) perpendicular to the first axial direction (R1). The rotating unit 64 connected with the twin-axial rotating element 10 is to drive the twin-axial rotating element 10 to undergo the limited pivotal motions about the first axial direction (R1) and the second axial direction (R2) so as thereby to further drive the light-reflecting member 63 to undergo the corresponding limited pivotal motions about the same first axial direction (R1) and the second axial direction (R2). In this embodiment, the first axial direction (R1) is perpendicular to the second axial direction (R2), the the first axial direction (R1) intersects the optical path 60 (i.e. the Z-axial direction in FIG. 1) by a 45 degree, and the second axial direction (R2) is also perpendicular to the optical path 60.

As shown in FIG. 1, when the light-reflecting member 63 is at an initial position (the first position), a first light image in an external first photo-ing area 81 can be just able to be redirected to image on the image-capturing unit 67 by the lens module 65. After the image-capturing unit 67 captures the first light image in the first photo-ing area 81, a corresponding electric signal can be produced and then transmitted to the control unit 68 for following processing. When the rotating unit 64 drives the twin-axial rotating element 10 associated with the light-reflecting member 63 thereon to undergo a limited pivotal motion about the first axial direction (R1), for example, so as to rotate clockwise to a second position, a foreign second light image in a second photo-ing area 81a can be redirected to the image-capturing unit 67 by the lens module 65, such thon the image-capturing unit 67 can capture the second light image of the second photo-ing area 81a and then transform it into a corresponding electric signal for being further transmitted to and processed by the control unit 68. On the other hand, when the rotating unit 64 drives the twin-axial rotating element 10 associated with the light-reflecting member 63 thereon to undergo another limited pivotal motion about the first axial direction (R1), for example, so as to rotate counter clockwise to a third position, a foreign third light image in a third photo-ing area 81*b* can be redirected to the image-capturing unit 67 by the lens module 65, such thon the image-capturing unit 67 can capture the third light image of the third photo-ing area 81*b* and then transform it into a corresponding electric signal for being further transmitted to and processed by the control unit 68.

Similarly, when the rotating unit 64 drives the twin-axial rotating element 10 associated with the light-reflecting member 63 thereon to undergo a limited pivotal motion about the second axial direction (R2), for example, so as to rotate clockwise to a fifth position, a foreign fifth light image in a fifth photo-ing area 81*c* can be redirected to the image-capturing unit 67 by the lens module 65, such thon the image-capturing unit 67 can capture the fifth light image of the fifth photo-ing area 81*c* and then transform it into a corresponding electric signal for being further transmitted to and processed by the control unit 68. On the other hand, when the rotating unit 64 drives the twin-axial rotating element 10 associated with the light-reflecting member 63 thereon to undergo another limited pivotal motion about the second axial direction (R2), for example, so as to rotate counter clockwise to a sixth position, a foreign sixth light image in a sixth photo-ing area 81*d* can be redirected to the image-capturing unit 67 by the lens module 65, such thon the image-capturing unit 67 can capture the sixth light image of the sixth photo-ing area 81*d* and then transform it into a corresponding electric signal for being further transmitted to and processed by the control unit 68. In addition, when the rotating unit 64 drives the light-reflecting member 63 back to its initial position (i.e. the fourth position), a foreign fourth light image in a fourth photo-ing area can be redirected to the image-capturing unit 67 by the lens module 65, such thon the image-capturing unit 67 can capture the fourth light image of the fourth photo-ing area and then transform it into a corresponding electric signal for being further transmitted to and processed by the control unit 68. In this embodiment, the fourth photo-ing area and the first photo-ing area 81 are exactly the same area. Of course, the rotating unit 64 can also drive the twin-axial rotating element 10 associated with the light-reflecting member 63 to undergo a twin-axial pivotal motion. In this instance, the photo-ing area would be shifted from the original first photo-ing area 81 to an upper or lower oblique position, which will be elucidated latterly. In this present invention, the mono-axial or the twin-axial pivotal motion of the twin-axial rotating element 10 driven by the rotating unit 64 is limited to a small angular range. In the preferred embodiment, the pivotal motion is limited to an angle ranged from 1 to 3 degrees, and, even with this limited range, the design purpose in attaining a wide-ranged, long-zoomed, or analogous panoramic imaging can be still achieved.

The lens-driving unit 66, engaged with the lens module 65 and electrically coupled with the control unit 68, can drive the lens module 65 to zoom or focus in the optical path 60 (i.e. the Z-axial direction) under the control of the control unit 68. In this embodiment, the lens-driving unit 66 can be a voice coil motor (VCM) consisted of permagnet magnets and coils, a piezo motor or any driving device the like. The display unit 69 includes a touch screen to display the light image captured by the image-capturing unit 67, or to display functional selections for the user to operate and/or adjust settings for the image-capturing device 6 or the imaging operation. The memory unit 70 includes a built-in static or dynamic RAM, or further includes a slot for receiving a memory card such as a micro SD. After the signal of the light image captured by the image-capturing unit 67 is processed by the control unit 68, the result can be stored into the memory unit 70. The power unit 71 including chargeable batteries and related circuits for recharging is to provide power to the image-capturing device 6. The human-machine unit 72 including plural solid buttons on the housing 61 and virtual functional keys on the touch screen allows the user to select and manipulate various operations of the image-capturing device 6. The I/O unit 73 including a connection port compatible with the USB or a wireless communication module such as a mobile communication module or a WLAN (wireless local area network) module allows the user to connect a foreign electronic device for possible data transmission.

As shown in FIG. 2, in this embodiment, the control unit 68 includes at least an inclination-control module 681, a focus-control module 682, an image-capturing module 683 and an image-integrating module 684. All of the inclination-control module 681, the focus-control module 682, the image-capturing module 683 and the image-integrating module 684 are constructed in a software form and stored in the memory unit 70. The inclination-control module 681 is to control the rotating unit 64 to drive the twin-axial rotating element 10 associated with the light-reflecting member 63 to rotate to a relevant position at a proper time. The focus-control module 682 is to control the lens-driving unit 66 to drive the lens module 65 to perform adequately zooming ad focusing so as to allow a foreign light image to be accurately imaged on the image-capturing unit 67. The image-capturing module 683 is to control operations of the image-capturing unit 67. After co-operating the inclination-control module 681, the image-capturing unit 67 can capture different light images corresponding to different positions from the light-reflecting member 63. The image-integrating module 684 is to process and integrate these different light images captured by image-capturing unit 67 and redirected by the light-reflecting member 63 into a single combined image.

Figure 4A:
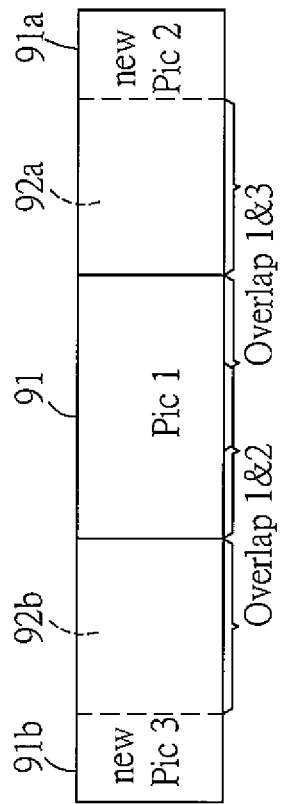
FIG. 4A shows three consecutive light images captured by image-capturing unit of the image-capturing device in accordance with the present invention, in which these three light images are captured at different photo-ing areas by rotating the light-reflecting member to three corresponding positions during the pivotal motion of FIG. 3.
Figure 4B:
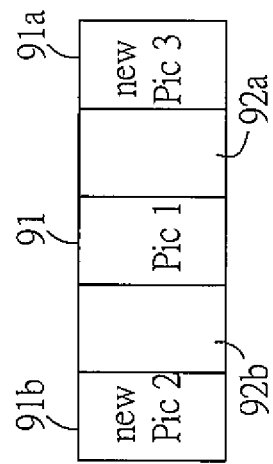
FIG. 4B shows a schematic view of overlapping the three light images of FIG. 4A.
Figure 4C:
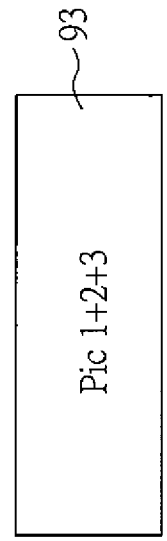
FIG. 4C shows schematically a single combined image after the overlapping of FIG. 4B.
Figure 3:
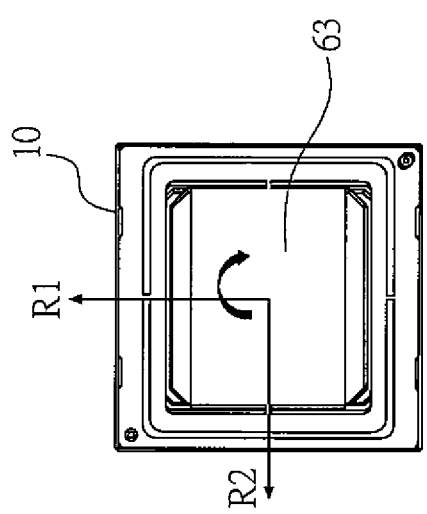
FIG. 3 demonstrates schematically a limited pivotal motion of the light-reflecting member driven by the twin-axial rotating element of the image-capturing device in accordance with the present invention, clockwise or counter clockwise about the first axial direction (R1)

Refer now to FIG. 3, FIG. 4A, FIG. 4B and FIG. 4C; where FIG. 3 demonstrates schematically a limited pivotal motion of the light-reflecting member driven by the twin-axial rotating element of the image-capturing device in accordance with the present invention, clockwise or counter clockwise about the first axial direction (R1), FIG. 4A shows three consecutive light images captured by image-capturing unit of the image-capturing device in accordance with the present invention, in which these three light images are captured at different photo-ing areas by rotating the light-reflecting member to three corresponding positions during the pivotal motion of FIG. 3, FIG. 4B shows a schematic view of overlapping the three light images of FIG. 4A, and FIG. 4C shows schematically a single combined image after the overlapping of FIG. 4B.

As shown, the first light image 91 is an image formed on the image-capturing unit 67 corresponding to the foreign light image in the first photo-ing area 81 while the twin-axial rotating element 10 associated with the light-reflecting member 63 is at the first position, the second light image 91*a* is an image formed on the image-capturing unit 67 corresponding to the foreign light image in the second photo-ing area 81*a* while the twin-axial rotating element 10 associated with the light-reflecting member 63 is at the second position, and the third light image 91*b* is an image formed on the image-capturing unit 67 corresponding to the foreign light image in the third photo-ing area 81*b* while the twin-axial rotating element 10 associated with the light-reflecting member 63 is at the third position. In this embodiment, as shown in FIG. 1 and FIG. 4A, the first photo-ing area 81 and the second photo-ing area 81a are partly overlapped in a horizontal direction, and the common or overlapped portion for the first light image 91 and the second light image 91a is defined as a duplicated image 92a. Similarly, the first photo-ing area 81 and the third photo-ing area 81b are partly overlapped in the horizontal direction, and the common or overlapped portion for the first light image 91 and the third light image 91b is defined as another duplicated image 92b. As shown in FIG. 4B, the control unit 68 can base on the duplicated images 92a, 92b to integrate horizontally the first light image 91, the second light image 91a and the third light image 91b so as to obtain the single combined image 93 resembled to the wide-ranged combined image shown in FIG. 4C. In this embodiment, the first light image, the second light image and the third light image have the same length, width and pixel value. However, at least one of the length, width and pixel value of the combined image is larger than that of the first light image 91. In this embodiment, the combined image 93 is a wide-ranged picture extending in a horizontal direction, and any of the width and the pixel value of this wide-ranged picture is larger than that of the first light image 91.

In the image-capturing method of the present invention, after the camera function is set to be a horizontal wide-ranged image mode, the user can simply push at a shutter button of the image-capturing device once, the image-capturing device would base automatically on the aforesaid image-capturing method to capture the first, second and third light images, and then the single combined image formed by the aforesaid integration would be displayed directly on the touch screen. Thus, in order to obtain a wide-ranged picture, the user needn't to rotate his/her own body as well as the whole set of the image-capturing device, but needs simply a depression at the shutter button.

Refer now to FIG. 5, FIG. 6A, FIG. 6B and FIG. 6C; where FIG. 5 demonstrates schematically a limited pivotal motion of the light-reflecting member driven by the twin-axial rotating element of the image-capturing device in accordance with the present invention, clockwise or counter clockwise about the second axial direction (R2), FIG. 6A shows three consecutive light images captured by image-capturing unit of the image-capturing device in accordance with the present invention, in which these three light images are captured at different photo-ing areas by rotating the light-reflecting member to three corresponding positions during the pivotal motion of FIG. 5, FIG. 6B shows a schematic view of overlapping the three light images of FIG. 6A, and FIG. 6C shows schematically a single combined image after the overlapping of FIG. 6B.

Similarly, as shown in FIG. 5, when the control unit 68 controls the rotating unit 64 to drive the twin-axial rotating element 10 associated with the light-reflecting member 63 thereon to undergo a pivotal motion about the second axial direction (R2) to go through at least a fourth position, a fifth position and a sixth position, the control unit 68 would simultaneously control the image-capturing unit 67 to capture individually at least a fourth light image (same as the first light image 91), a fifth light image 91c and a sixth light image 92d corresponding to different positions of the twin-axial rotating element 10. The fourth light image 91 is an image formed on the image-capturing unit 67 corresponding to the foreign light image in the fourth photo-ing area (same as the first photo-ing area 81) while the twin-axial rotating element 10 associated with the light-reflecting member 63 is at the fourth position, the fifth light image 91c is an image formed on the image-capturing unit 67 corresponding to the foreign light image in the fifth photo-ing area 81c while the twin-axial rotating element 10 associated with the light-reflecting member 63 is at the fifth position, and the sixth light image 91d is an image formed on the image-capturing unit 67 corresponding to the foreign light image in the sixth photo-ing area 81d while the twin-axial rotating element 10 associated with the light-reflecting member 63 is at the sixth position. As shown in FIG. 1 and FIG. 6A, the fourth photo-ing area 81 and the fifth photo-ing area 81c are partly overlapped in a vertical direction, and the common or overlapped portion for the fourth light image 91 and the fifth light image 91c is defined as a duplicated image 92c. On the other hand, the fourth photo-ing area 81 and the sixth photo-ing area 81d are partly overlapped in the vertical direction, and the common or overlapped portion for the fourth light image 91 and the sixth light image 91d is defined as another duplicated image 92d. As shown in FIG. 6B, the control unit 68 can base on the duplicated images 92c, 92d to integrate vertically the fourth light image 91, the fifth light image 91c and the sixth light image 91d so as to obtain the single combined image 94 resembled to the wide-ranged combined image shown in FIG. 6C. In this embodiment, the fourth light image, the fifth light image and the sixth light image have the same length, width and pixel value. However, at least one of the length, width and pixel value of the combined image 94 is larger than that of the fourth light image 91. In this embodiment, the combined image 94 is a wide-ranged picture extending in a vertical direction, and any of the length and the pixel value of this wide-ranged picture is larger than that of the fourth light image 91. Similarly, by providing the image-capturing method of the present invention, after the camera function is set to be a vertical wide-ranged image mode, the user can simply push at a shutter button of the image-capturing device once, the image-capturing device would base automatically on the aforesaid image-capturing method to capture the fourth, fifth and sixth light images, and then the single combined image formed by the aforesaid integration would be displayed directly on the touch screen. Thus, in order to obtain a wide-ranged picture, the user needn't to rotate his/her own body as well as the whole set of the image-capturing device, but needs simply a depression at the shutter button.

Refer now to FIG. 7, FIG. 8A and FIG. 8B; where FIG. 7 demonstrates schematically a limited twin-axial pivotal motion of the light-reflecting member driven by the twin-axial rotating element of the image-capturing device in accordance with the present invention, clockwise or counter clockwise about a twin-axial direction made up by the first axial direction (R1) and the second axial direction (R2), FIG. 8A shows five consecutive light images captured by image-capturing unit of the image-capturing device in accordance with the present invention, in which these five light images are captured at different photo-ing areas by rotating the light-reflecting member to five corresponding positions, and FIG. 8B shows schematically a single combined image after integrating the five light images of FIG. 8A.

Similarly, as shown in FIG. 7, when the control unit 68 controls the rotating unit 64 to drive the twin-axial rotating element 10 associated with the light-reflecting member 63 thereon to undergo a twin-axial pivotal motion about the first axial direction (R1) and the second axial direction (R2) to go through at least a seventh position, an eighth position, a ninth position, a tenth position and an eleventh position, the control unit 68 would simultaneously control the image-capturing unit 67 to capture individually at least a seventh light image (same as the first light image 91), an eighth light image 91e, a ninth light image 91f, a tenth light image 91g and an eleventh light image 91h corresponding to different positions of the twin-axial rotating element 10. The eighth, ninth, tenth and eleventh light images 91e, 91f, 91g, 91h are partly overlapped individually with the seventh light image 91. The control unit 68 can base on the duplicated images between the seventh light image 91 and every one of the eighth, ninth, tenth and eleventh light images 91e, 91f, 91g, 91h to integrate and thus obtain the single combined image 95. In this embodiment, the seventh, eighth, ninth, tenth and eleventh light images 91, 91e, 91f, 91g, 91h all have the same length, width and pixel value. However, the length (height), width and pixel value of the combined image 95 are all larger than those of the seventh light image 91, so that an imaging performance resembled to an imaging by wide-ranged lens can be obtained with a better pixel value. Namely, in the aforesaid application, a wide-ranged image upon a wider ranged photo-ing area can be captured without sacrificing the image resolution. Also, with the same photo-ing area and the same image-capturing unit, the image obtained according to the aforesaid image-capturing method can produce an image with a super high resolution. Similarly, by providing the image-capturing method of the present invention, after the camera function is set to be a twin-axial wide-ranged image mode, the user can simply push at a shutter button of the image-capturing device once, the image-capturing device would base automatically on the aforesaid image-capturing method to capture the seventh, eighth, ninth, tenth and eleventh light images and then the single combined image formed by the aforesaid integration would be displayed directly on the touch screen. Thus, in order to obtain a more wider ranged picture with sacrificing the resolution, the user needn't to rotate his/her own body as well as the whole set of the image-capturing device, but needs simply a depression at the shutter button.

Figure 9:
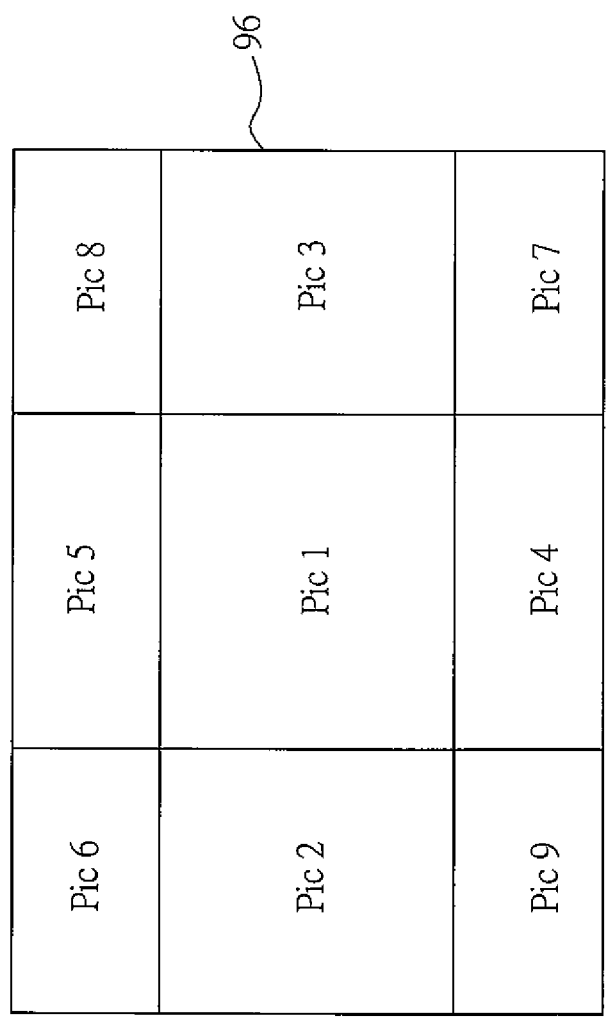
FIG. 9 shows a combined image formed by overlapping a plurality of light images captured at different photo-ing areas in accordance with the image-capturing method of the present invention.

Referring now to FIG. 9, a combined image formed by overlapping a plurality of light images captured at different photo-ing areas in accordance with the image-capturing method of the present invention is shown. As described above, the image-capturing method of the present invention can also be applied to integrate the aforesaid embodiments from FIG. 3 to FIG. 8B, so as to have the image-capturing device of the present invention to apply the control unit 68 to control the rotating unit 64 to drive the twin-axial rotating element 10 associated with the light-reflecting member 63 to undergo mono-axial and twin-axial pivotal motions about the first axial direction (R1) and the second axial direction (R2) and to capture orderly nine light images arranged in a 3×3 matrix form. Then, these nine light images can be integrated to form a combined image 96 equivalent to an image with a wider range, a bigger size and a higher pixel value. Namely, in this application, a wider-ranged image can be obtained without sacrificing the resolution.

Figure 10:
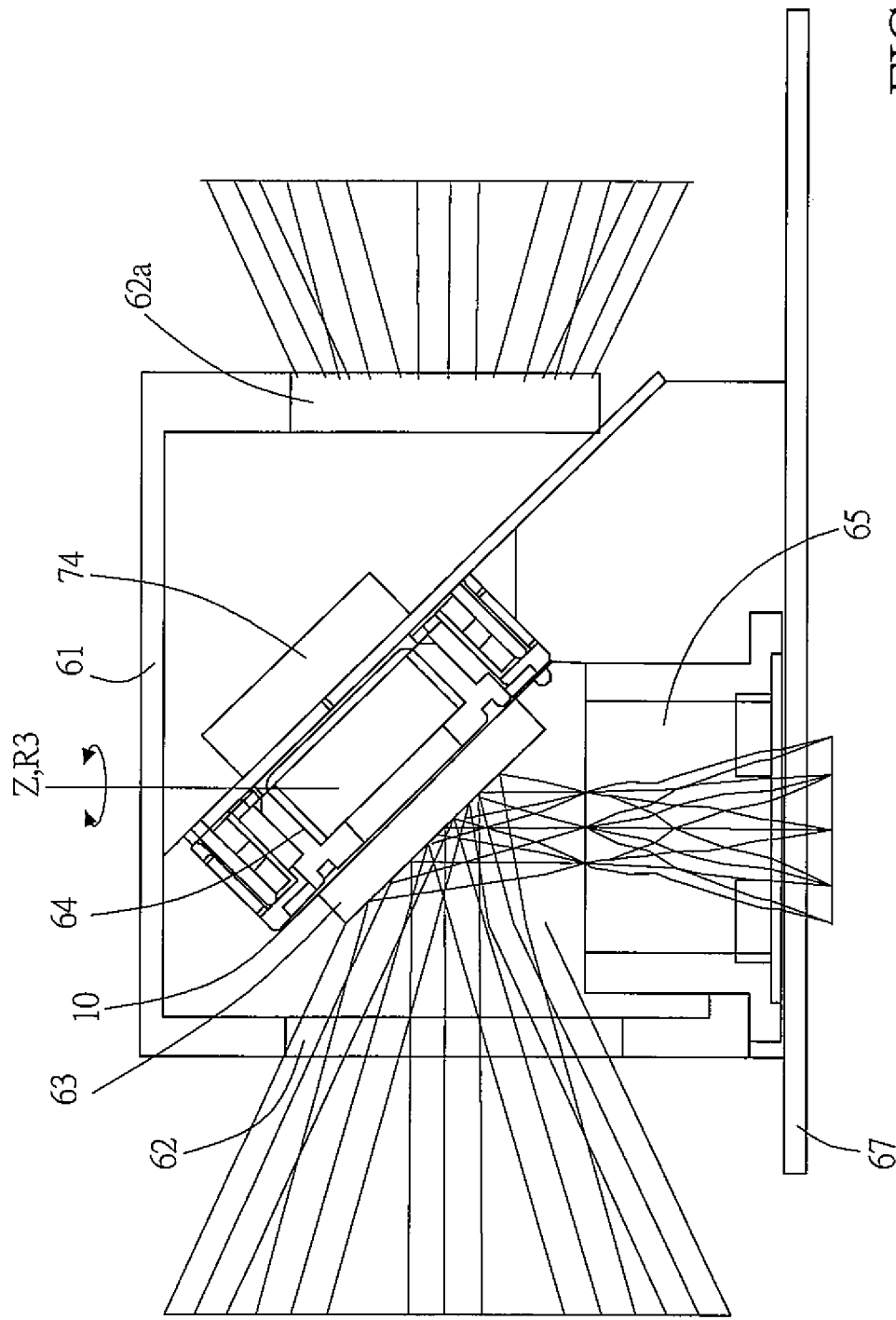
FIG. 10 shows schematically a view of an image-capturing device having a switch mechanism in accordance with the present invention.
Figure 11:
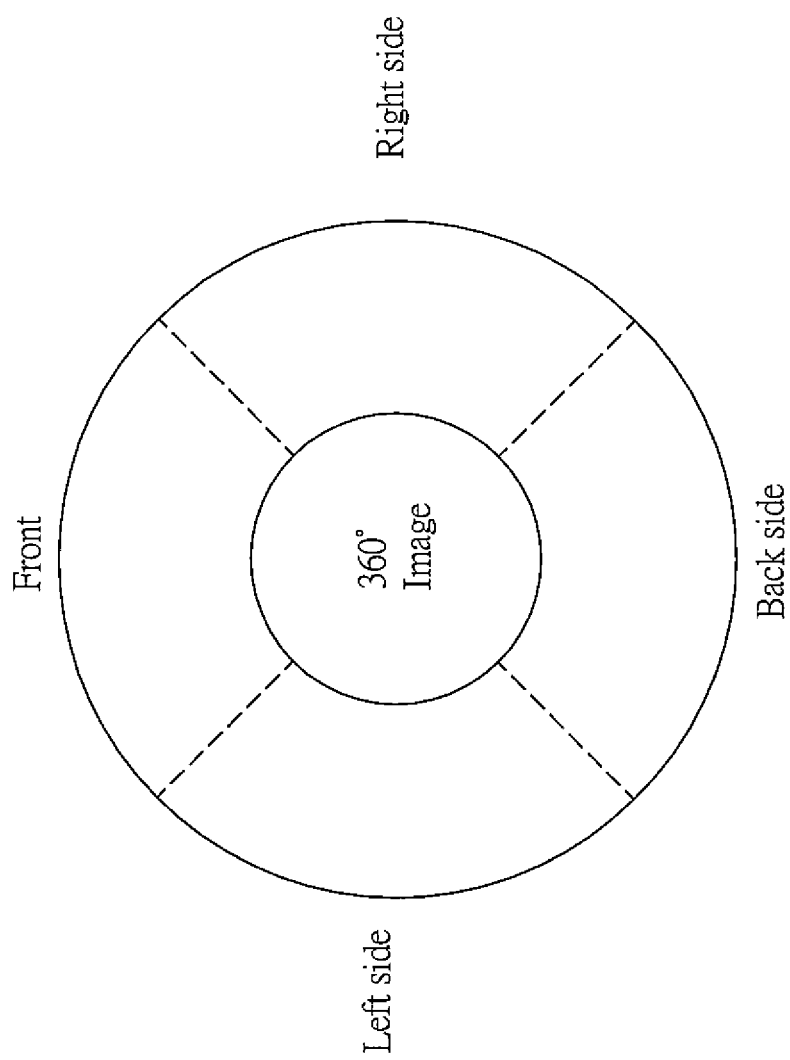
FIG. 11 is a schematic view of a panoramic combined image captured, in a 360° manner, by the image-capturing method in accordance with the present invention.

Referring now to FIG. 10, a schematic view of an image-capturing device having a switch mechanism in accordance with the present invention is shown. In this embodiment of the present invention, the image-capturing device 6 can further include a switch mechanism 74 engaged with the rotating unit 64. The switch mechanism 74 can drive the rotating unit 64 associated with the twin-axial rotating element 10 and light-reflecting member 63 thereon to rotate about a third axial direction (R3). Namely, the rotating unit 64 and the light-reflecting member 63 are driven simultaneously by the switch mechanism 74 to undergo a 360-degree rotation about the third axial direction (R3). In this embodiment, the third axial direction (R3) is parallel to or collinear with the optical path 60 (i.e. the Z-axial direction). Namely, the first axial direction (R1) is perpendicular to the second axial direction (R1), the second axial direction (R2) is perpendicular to the third axial direction (R3), and an angle between the first axial direction (R1) and the third axial direction (R3) is 45 degrees. In this embodiment, the image-capturing device 6 located corresponding to the switch mechanism 74 on the housing 61 can drive the rotating unit 64 to rotate about the third axial direction (R3), and on this rotation path a plurality of light-introducing windows 62, 62a (preferably, arranged into a ring shape) are included at specific positions. Referring to FIG. 11, a schematic view of a panoramic combined image captured, in a 360° manner, by the image-capturing method in accordance with the present invention is shown. The switch mechanism 74 drives the rotating unit 64 associated with the twin-axial rotating element 10 and light-reflecting member 63 thereon to rotate about the third axial direction (R3) by 360 degrees. Simultaneously, the control unit 68 controls the image-capturing unit 67 to capture individually a plurality of foreign light images at specific positions of the twin-axial rotating element 10 during the 360-degree rotation about the third axial direction (R3). While in capturing the plurality of the light images, every two neighboring light images are overlapped partly. These light images are then integrated into a single combined image so as to obtain a 360-degree panoramic combined image. In this embodiment, the light-reflecting member 63 is a reflective lens located at the twin-axial rotating element 10.

Figure 12A:
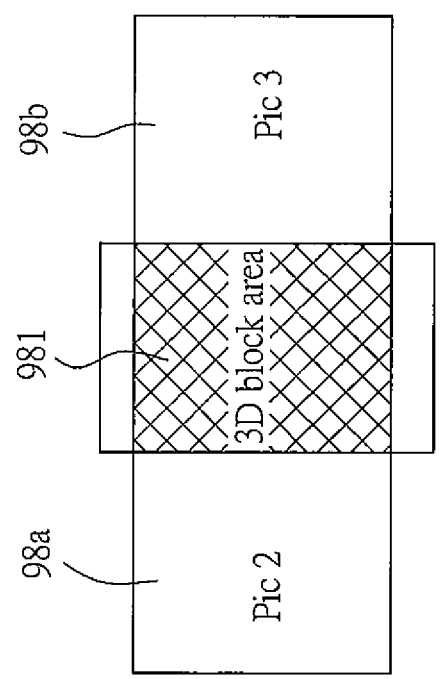
FIG. 12A shows schematically an analogous 3D image captured by the image-capturing method in accordance with the present invention.
Figure 12B:
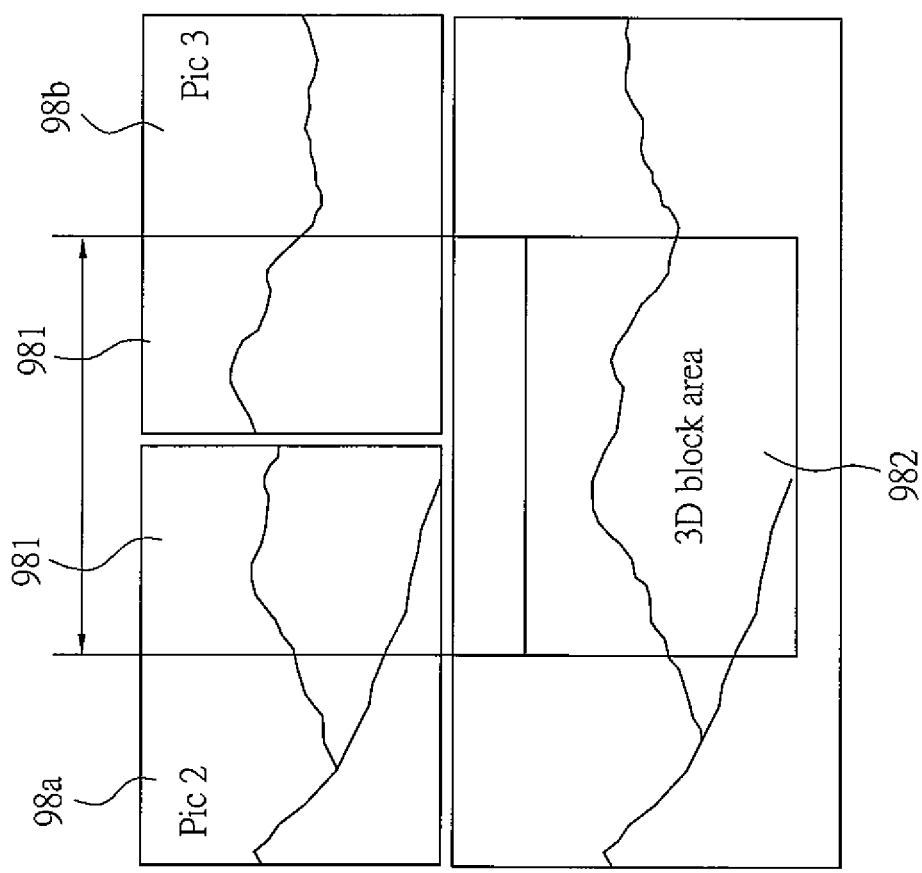
FIG. 12B shows a typical example for FIG. 12A.

Refer now to FIG. 12A and FIG. 12B; where FIG. 12A shows schematically an analogous 3D (three dimensional) image captured by the image-capturing method in accordance with the present invention, and FIG. 12B shows a typical example for FIG. 12A. In this application, the rotating unit 64 drives the twin-axial rotating element 10 associated with the light-reflecting member 63 thereon to rotate about the first axial direction (R1), and, during the rotation, the image-capturing unit 67 captures two different light images 98a, 98b in respective two photo-ing areas in a horizontal direction, in which these two light images 98a, 98b are overlapped partly. Then, the control unit 68 would base on the duplicated image 981 of these two light images 98a, 98b to perform an analogous 3D-image process, so that an analogous 3D image 982 resulted from the duplicated image 981 can be obtained.

Figure 13:
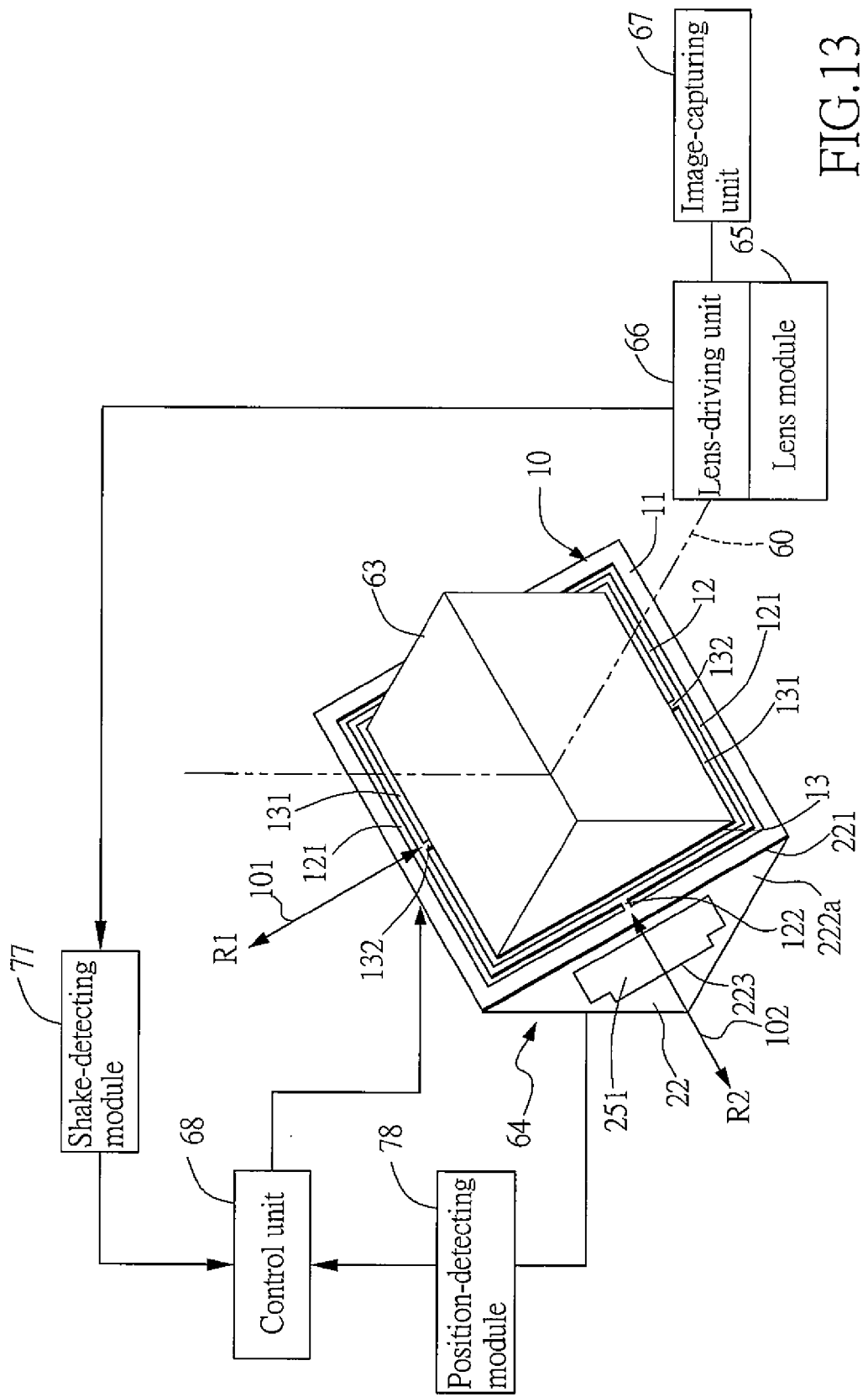
FIG. 13 demonstrates schematically the mounting of the twin-axial rotating element and the rotating unit on the image-capturing device of the present invention.
Figure 14A:
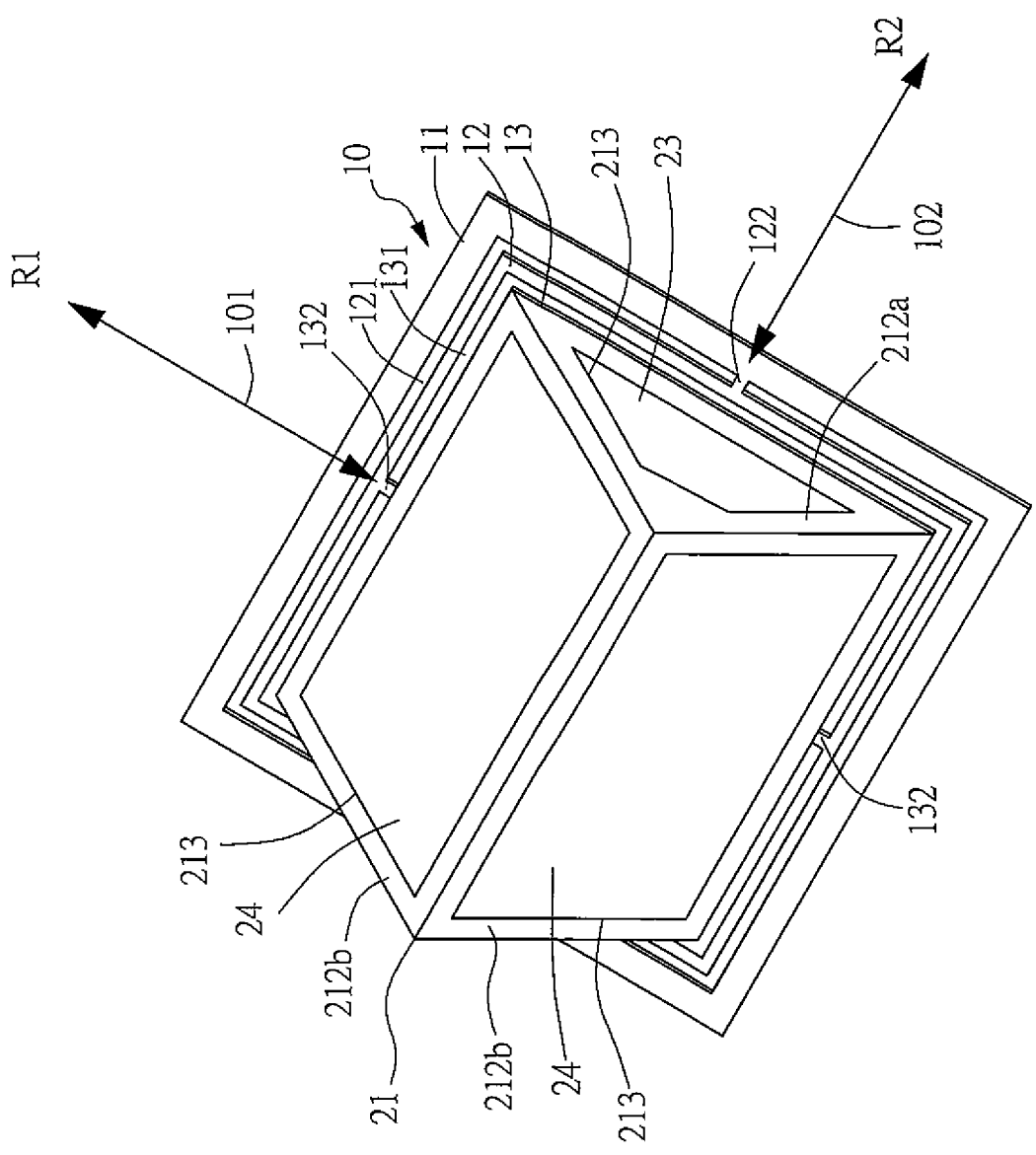
FIG. 14A is a schematic perspective view of the twin-axial rotating element and the rotating unit after the inner carrier structure and the magnets are assembled together, in a bottom-view direction.
Figure 14B:
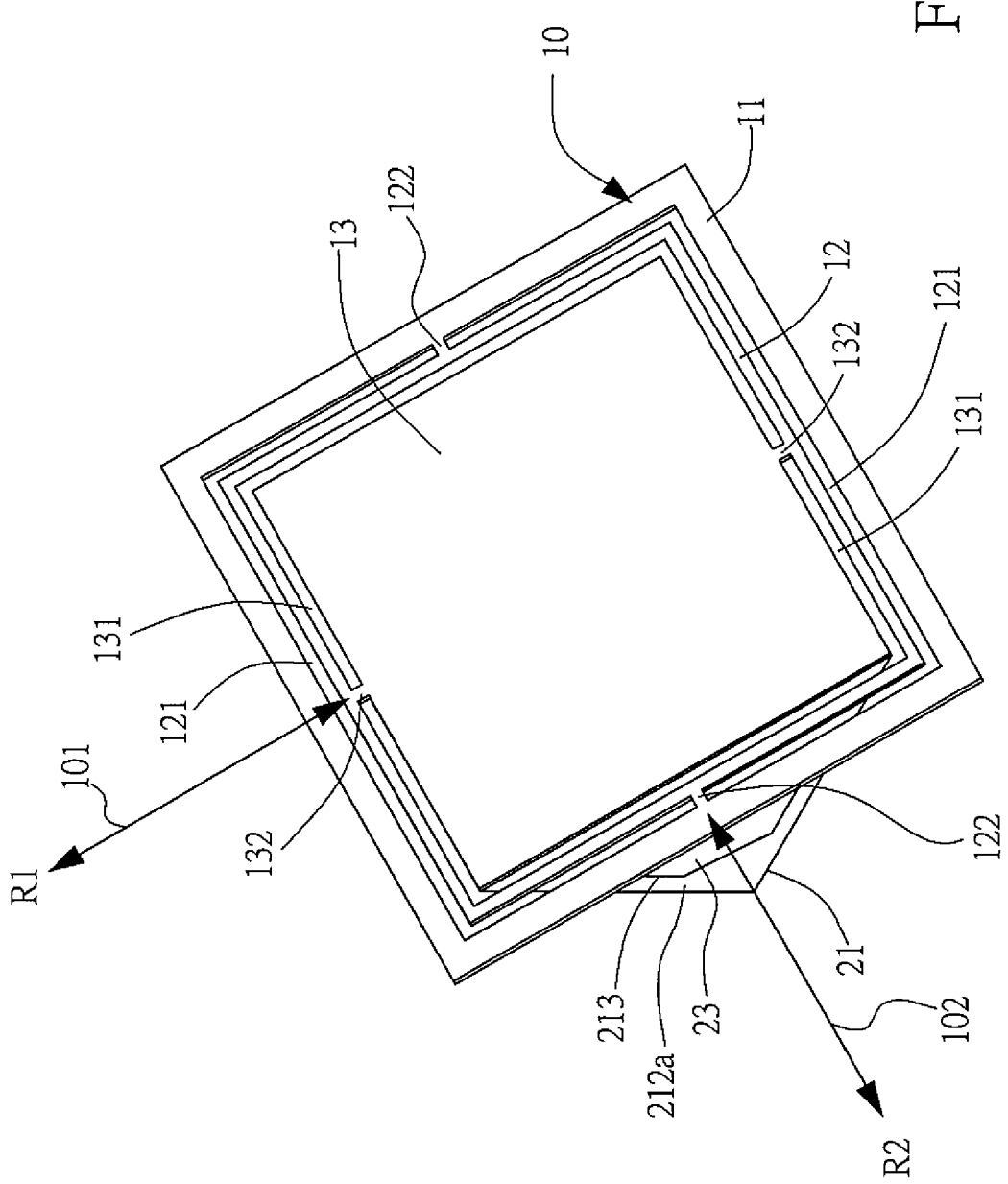
FIG. 14B is another view of FIG. 14A, in a top-view direction.
Figure 15:
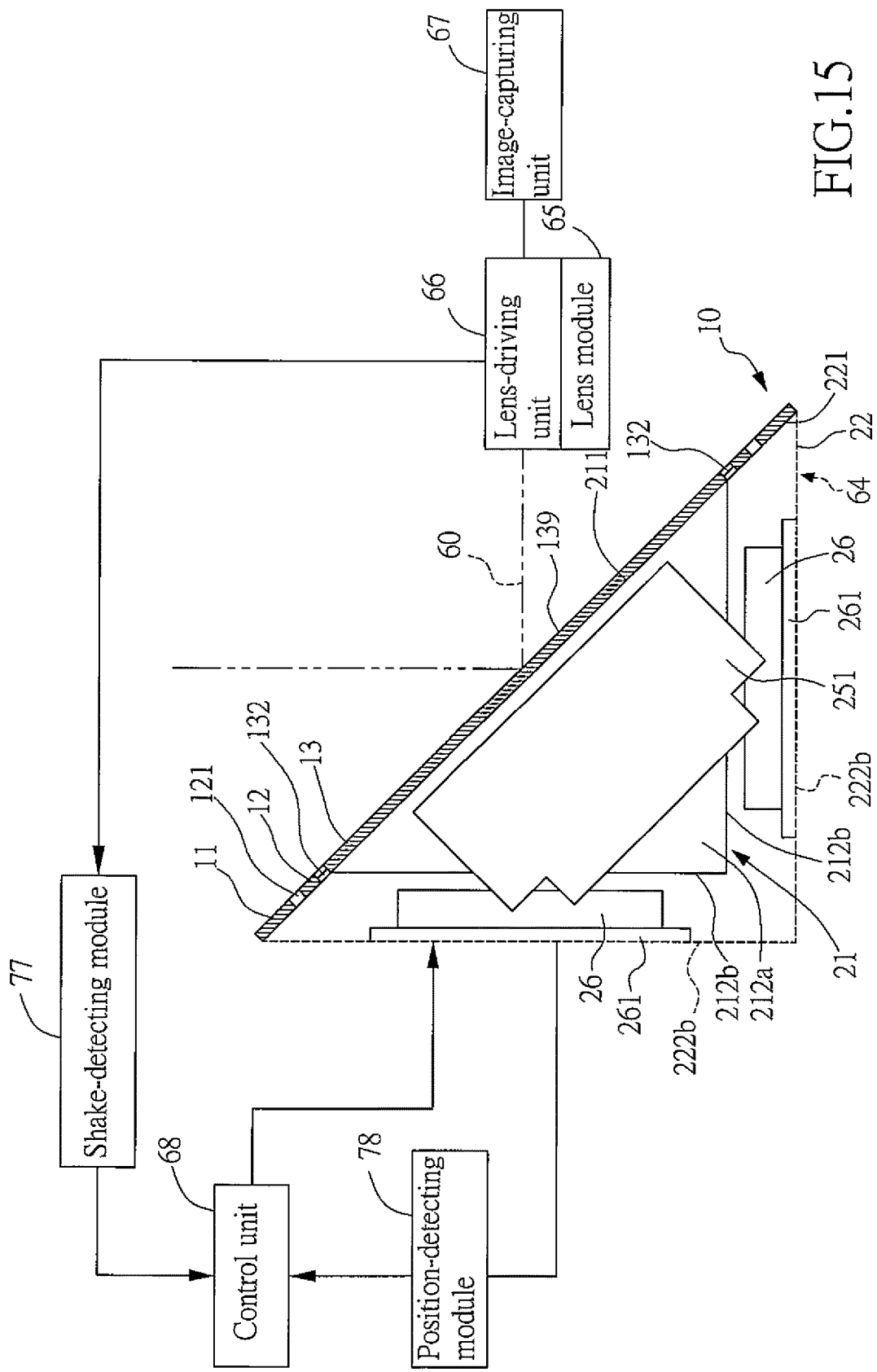
FIG. 15 is a schematic lateral side view of FIG. 13.
Figure 16:
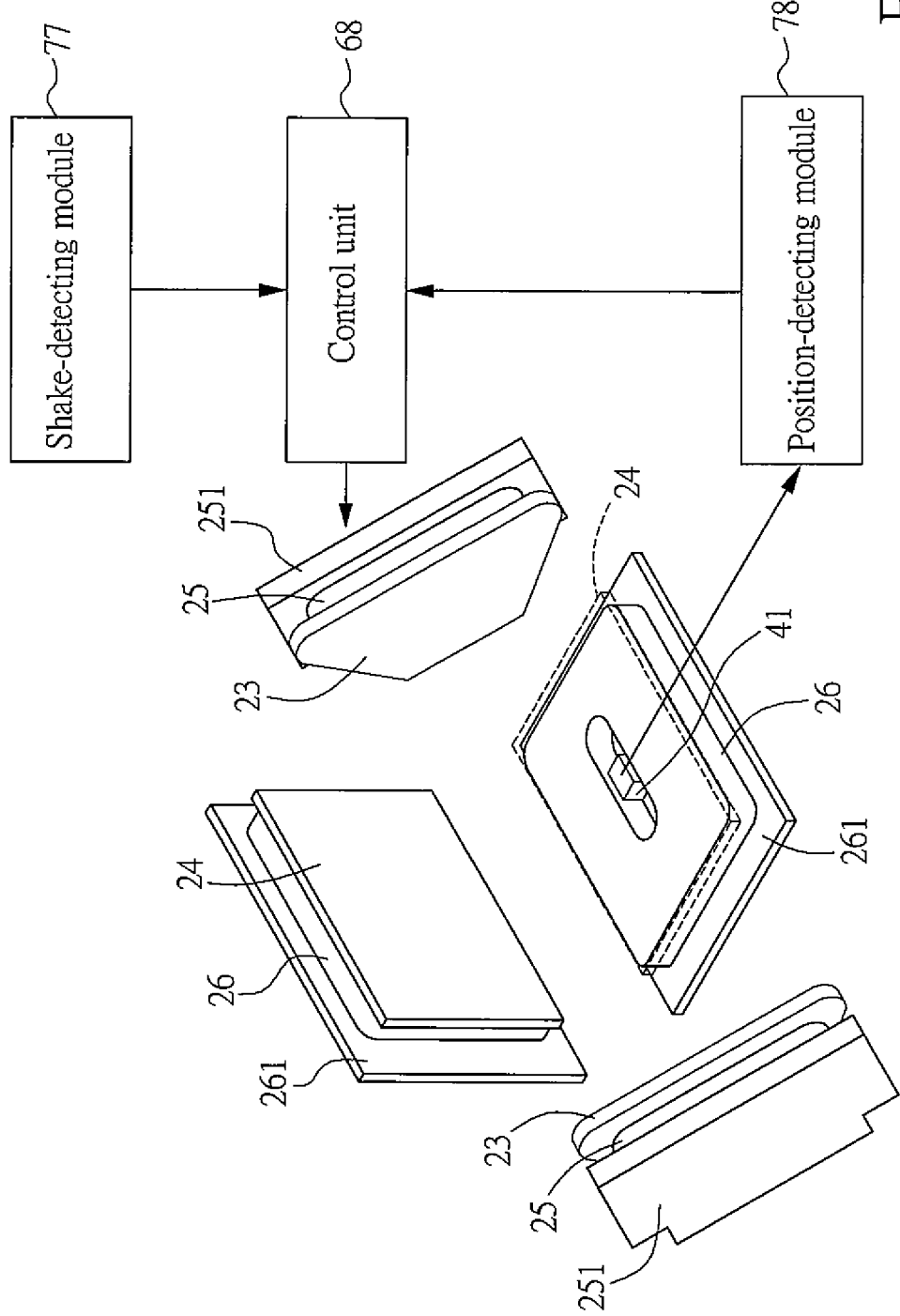
FIG. 16 is a schematic exploded view showing a position relationship among the magnets, the coils, the circuit boards and the magnet-detecting members of the rotating unit in accordance with the present invention.

Refer now to FIG. 13 through FIG. 16; where FIG. 13 demonstrates schematically the mounting of the twin-axial rotating element and the rotating unit on the image-capturing device of the present invention, FIG. 14A is a schematic perspective view of the twin-axial rotating element and the rotating unit after the inner carrier structure and the magnets are assembled together in a bottom-view direction, FIG. 14B is another view of FIG. 14A in a top-view direction, FIG. 15 is a schematic lateral side view of FIG. 13, and FIG. 16 is a schematic exploded view showing a position relationship among the magnets, the coils, the circuit boards and the magnet-detecting members of the rotating unit in accordance with the present invention.

In a preferred embodiment of the image-capturing device in accordance with the present invention, the assembly of the twin-axial rotating element 10 and the rotating unit 64 can provide the partly-overlapped light images for being further integrated into a single combined image, and can also provide an optical anti-shake function. As shown in FIG. 13, except for the assembly of the twin-axial rotating element 10 and the rotating unit 64, the image-capturing device of the present invention can further include a shake-detecting module 30 and a position-detecting module 40, such that the assembly of the twin-axial rotating element 10 and the rotating unit 64 can be equipped with an optical anti-shake function.

The twin-axial rotating element 10 located on the optical path 60 can perform at least a limited pivotal motion about a first axial direction (R1) 101 and a second axial direction (R2) 102 perpendicular to the first axial direction 101. As shown in FIG. 14B, in this embodiment, the twin-axial rotating element 10 is formed as a rectangular thin spring plate having four lateral sides and further including an outer frame portion 11, a middle frame portion 12, and an inner plate portion 13. The inner plate portion 13 has a plane facing the optical path, and the first axial direction (R1) 101 and the second axial direction (R2) 102 are defined on this plane. The middle frame portion 12 circles around a periphery of the inner plate portion 13. At least one first through trench 131 is formed between the middle frame portion 12 and the inner plate portion 13 for separating the middle frame portion 12 and the inner plate portion 13, and two first connection ribs 132 aligned in the first axial direction (R1) 101 are provided between the middle frame portion 12 and the inner plate portion 13 for connecting the middle frame portion 12 and the inner plate portion 13. As shown, the two first connection ribs 132 are located to two opposing sides of the inner plate portion 13 in a manner of dividing the at least one first through trench 131 into two U-shape first through trenches 131. By providing these two first connection ribs 132, the inner plate portion 13 and the middle frame portion 12 are thus connected. In addition, the outer frame portion 11 circles around a periphery of the middle frame portion 12. At least one second through trench 121 is formed between the outer frame portion 11 and the middle frame portion 12 for separating the outer frame portion 11 and the middle frame portion 12, and two second connection ribs 122 aligned in the second axial direction (R2) 102 are provided between the outer frame portion 11 and the middle frame portion 12 for connecting the outer frame portion 11 and the middle frame portion 13. As shown, the two second connection ribs 122 are located to two opposing sides of the middle frame portion 12 in a manner of dividing the at least one second through trench 121 into two U-shape second through trenches 121. By providing these two second connection ribs 122, the middle frame portion 12 and the outer frame portion 11 are thus connected. Namely, these two first connection ribs 132 and the two second connection ribs 122 are arranged into two pairs located to respective opposing sides of the rectangular thin spring plate, such that, by providing elasticity of the thin spring plate, the inner plate portion 13 can undergo a limited pivotal motion with respect to the outer frame portion 11 about a line passing through the two first connection ribs 132 (i.e. the first axial direction 101), and the inner plate portion 13 can undergo another limited pivotal motion with respect to the outer frame portion 11 about a line passing through the two second connection ribs 122 (i.e. the second axial direction 102). Upon such an arrangement, the design goal of the twin-axial rotating element 10 to provide twin-axial pivotal motions can be achieved. Hence, by providing trenching on the thin spring plate so as to form a multi-frame structure, the twin-axial rotating element 10 as a unique piece with a simple structure, a small size and a lower cost can be thus obtained.

As shown from FIG. 13 to FIG. 16, the rotating unit 64 connected with the twin-axial rotating element 10 is to drive the twin-axial rotating element 10 to undergo respective limited pivotal motions about the first axial direction (R1) 101 and the second axial direction (R2) 102. In this embodiment, the rotating unit 64 is an electromagnetic driving module including at least an inner carrier structure 21, an outer carrier structure 22, at least one first magnet 23, at least one second magnet 24, at least one first coil 25, and at least one second coil 26.

The inner carrier structure 21 is engaged on a bottom of the inner plate portion 13 so as to co-move with the inner plate portion 13, and the outer carrier structure 22 is fixed with a bottom of the outer frame portion 11.

One of the first magnet 23 and the first coil 25 is mounted at the inner carrier structure 21, while another thereof is mounted at the outer carrier structure 22. In this embodiment, two first magnets 23 are mounted individually to two opposing sides of the inner carrier structure 21 by closing to the two second connection ribs 122, and two first coils 25 are mounted individually to two opposing sides of the outer carrier structure 22 by closing to the two second connection ribs 122 and at locations corresponding to the two first magnets 23. By energizing the two first coils 25, a corresponding electromagnetic force can be produced to push the two first magnets 23 and the inner plate portion 13 on the inner carrier structure 21 to undergo a pivotal motion about the first axial direction (R1) 101.

One of the second magnet 24 and the second coil 26 is mounted at the inner carrier structure 21, while another thereof is mounted at the outer carrier structure 22. In this embodiment, two second magnets 24 are mounted individually to two opposing sides of the inner carrier structure 21 by closing to the two first connection ribs 132, and two second coils 26 are mounted individually to two opposing sides of the outer carrier structure 22 by closing to the two first connection ribs 132 and at locations corresponding to the two second magnets 24. By energizing the two second coils 26, a corresponding electromagnetic force can be produced to push the two second magnets 24 and the the inner plate portion 13 on the inner carrier structure 21 to undergo another pivotal motion about the second axial direction (R2) 102.

The inner carrier structure 21 is a wedge-shape frame structure having a rectangular first contact portion 211 connecting the bottom of the inner plate portion 13 and four first side surfaces 212a, 212b extending from corresponding lateral sides of the rectangular first contact portion 211 in respective directions away of the inner plate portion 13. Two 212a of these four first side surfaces are shaped to two right triangles standing on opposing lateral sides of the rectangular first contact portion 211 in a parallel manner, while another two 212b of the four first side surfaces are shaped to two rectangles standing on another two opposing lateral sides of the rectangular first contact portion 211 in a manner of connecting at top sides thereof in a right angle. Further, on each of the first side surfaces 212a, 212b, a first accommodation base 213 is included. On the other hand, the outer carrier structure 22 is another wedge-shape frame structure having a rectangular second contact portion 221 connecting the bottom of the outer frame portion 11 and four second side surfaces 222a, 222b extending from corresponding lateral sides of the rectangular second contact portion 221 in respective directions away of the outer frame portion 11. Two 222a of these four second side surfaces are shaped to two right triangles standing on opposing lateral sides of the rectangular second contact portion 221 in a parallel manner, while another two 222b of the four second side surfaces are shaped to two rectangles standing on another two opposing lateral sides of the rectangular second contact portion 221 in a manner of connecting at top sides thereof in a right angle. Further, on each of the second side surfaces 222a, 222b, a second accommodation base 223 is included. In this embodiment, the first magnet 23 is mounted into the first accommodation base 213 of the triangular first side surface 212a of the inner carrier structure 21, and the first coil 25 is mounted into the second accommodation base 223 of the triangular second lateral side surface 222a of the outer carrier structure 22 via a first circuit board 251. The second magnet 24 is mounted into the first accommodation base 213 of the rectangular first side surface 212b of the inner carrier structure 21, and the second coil 26 is mounted into the second accommodation base 223 of the rectangular second lateral side 222b of the outer carrier structure 11 via a second circuit board 261. By providing the aforesaid specific wedge-shaped frame structures to the inner and outer carrier structures 21, 22 and further to mount the magnets 23, 24 and the coils 25, 26, the electromagnetic rotating unit featured in simple structuring, easy assembling, small voluming and lower costing can be thus mounted easily into a typical optical system such as a digital camera or digital recorder.

The shake-detecting module 77 is mounted on the the lens module 65, and the position-detecting module 40 is mounted on the rotating unit 64. In the present invention, when the assembly of the twin-axial rotating element 10 and the rotating unit 64 is preset to perform an additional anti-shake application, the shake-detecting module 77 can be applied to detect the shake of the lens module 65. Namely, the shake-detecting module 77 detects position deviations in the two axial directions perpendicular to the optical path 60 caused by shaking the lens module 65. Further, the position-detecting module 40 can detect the pivotal angles of the twin-axial rotating element 10 about the first axial direction (R1) 101 and the second axial direction (R2) 102. As shown in FIG. 16, the position-detecting module 40 further includes a first magnet-detecting member located at a center of the first coil 25 by corresponding to the first magnet 23 and a second magnet-detecting member 41 located at a center of the second coil 26 by corresponding to the second magnet 24. By providing the first and second magnet-detecting members to detect the variations in the magnetic field, the corresponding pivotal angle of the twin-axial rotating element 10 can thus be computed by the control unit 68.

In this embodiment, the light-reflecting member 63 is located on the plane of the inner plate portion 13 of the twin-axial rotating element 10 so as to be adjusted to have the light on the optical path 60 to radiate the lens module 65. As shown in FIG. 1, the light-reflecting member 63 is a wedge prism located on the plane of the inner plate portion 13 to redirect the incident light to the lens module 65 and the image-capturing unit 67 in a 90-degree deflective manner. However, in another embodiment of the present invention, the light-reflecting member 63 can be a light-reflecting layer 139 painted directly on the plane of the inner plate portion 1, as shown in FIG. 15. Similarly, the light-reflecting layer 139 is also able to deflect the optical path 60 by redirecting the incident light to the lens module 65 and the image-capturing unit 67 in a 90-degree deflective manner.

In the present invention, the control unit 68 is electrically coupled with the shake-detecting module 77, the position-detecting module 78 and the rotating unit 64 so as to base on the shake of the lens module 65 detected by the shake-detecting module 77 and the pivotal angle of the twin-axial rotating element 10 detected by the position-detecting module 78 to control the rotating unit 64 to drive the twin-axial rotating element 10 to undergo a respective pivotal motion, such that the deviations on the optical path 60 caused by the shake at the lens module 65 can be corrected. In the present invention, the mono-axial or twin-axial pivotal motion of the twin-axial rotating element 10 driven by the rotating unit 64 is limited within a small angular range. In the present invention, when the pivotal motion of the twin-axial rotating element 10 driven by the rotating unit 64 is to compensate the shaking deviations, the pivotal motion is usually limited to be within 1 degree. On the other hand, when the pivotal motion of the twin-axial rotating element 10 driven by the rotating unit 64 is to provide a wide-ranged, long-scene or analogous panoramic imaging (the switch mechanism 74 is required for obtaining the panoramic imaging), then the pivotal motion is usually limited to be within a range of 1-3 degrees (preferably around 2 degrees).

In the embodiment of the twin-axial rotating element and the rotating unit shown in FIGS. 13-16 above, magnetic pushing forces are generated by means of the flat magnets 23,24 and their corresponding flat coils 25,26, in order to drive the light-reflecting member 63 (or light-reflecting layer 139) furnished on the inner plate portion 13 to rotate. However, such magnetic driving mechanism using "flat" magnets 23,24 and "flat" coils 25,26 is only suitable for providing relatively small angle of rotations. When the required rotating angle is greater than 3 degrees (>3°), severe variation of the gap between such flat magnet and flat coiled will happen and thus causes: (a) decreased electric-magnetic driving efficiency due to the variation of the relative angle between the magnet and the coil, and (b) higher risk for the magnet to interfere (collide) nearby component (for example, the circuit board furnishing the coil) during its rotation. Therefore, the invention further discloses a novel structure using arc magnets and arc coils, so as to maintain a stable electric-magnetic driving efficiency and avoid interference when large angle rotations are performed.

Figure 17:
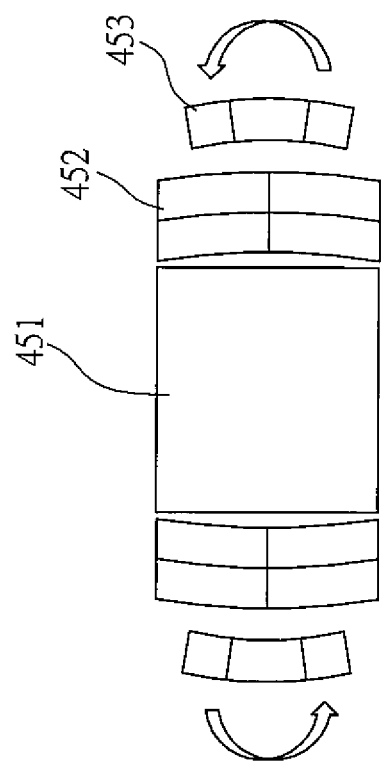
FIG. 17 is a schematic drawing showing an example of image-capturing device of the invention having an electric-magnetic driven rotating unit comprising an arc magnet and an arc coil.

Please refer to FIG. 17, which is a schematic drawing showing an example of image-capturing device of the invention having an electric-magnetic driven rotating unit comprising an arc magnet and an arc coil. As shown in FIG. 17, the invention discloses a rotating unit driven by electric-magnetic forces generated by using arc magnets 452 and arc coils 453, which can drive a lens module (or light-reflecting member) 451 to rotate about at least one axis. By using the arc magnets 452 to cooperate with the arc coils 453, no interference happens when the lens module (or light-reflecting member) 451 is rotated in a large angle; in addition, decay of electric-magnetic force caused by the variation of gap between the magnet and coil during the rotations can also be decreased.

Figure 18:
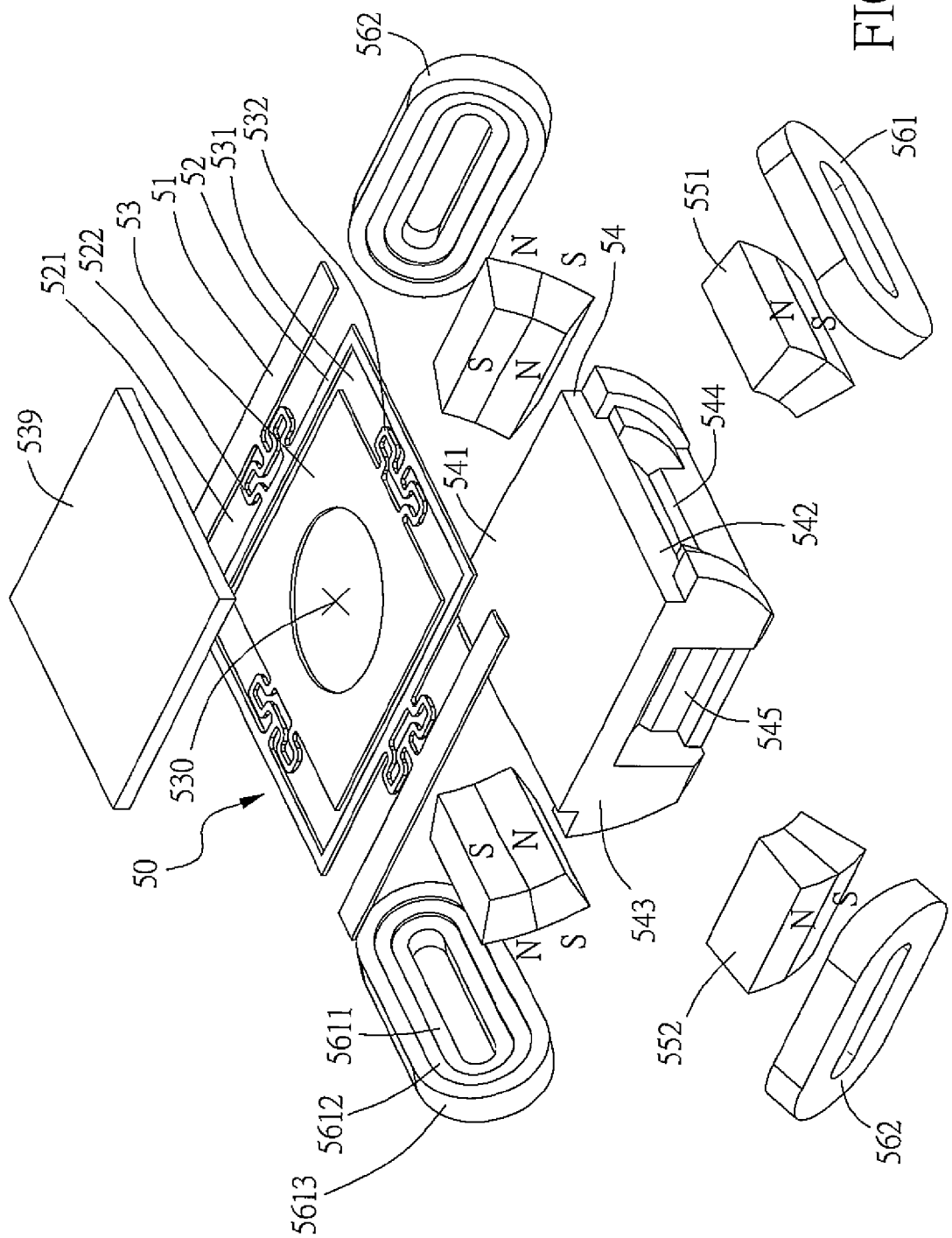
FIG. 18 is an exploded perspective view of an embodiment of the rotating unit comprising an arc magnet and an arc coil of the image-capturing device of the invention.
Figure 19:
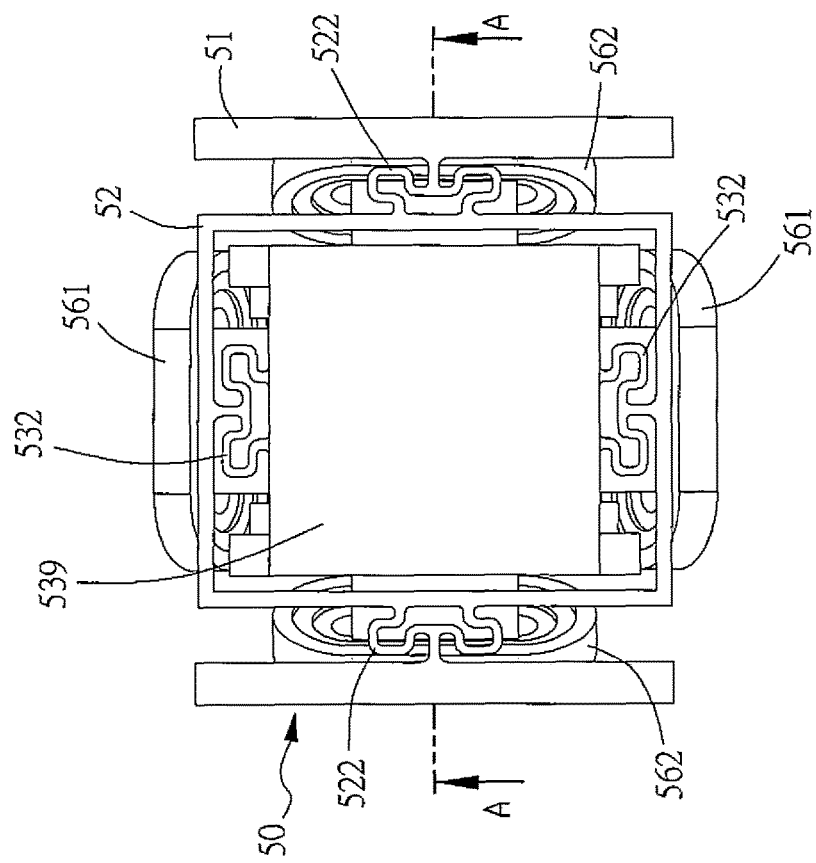
FIG. 19 is a top assembling view of the rotating unit of the invention as shown in FIG. 18.
Figure 20:
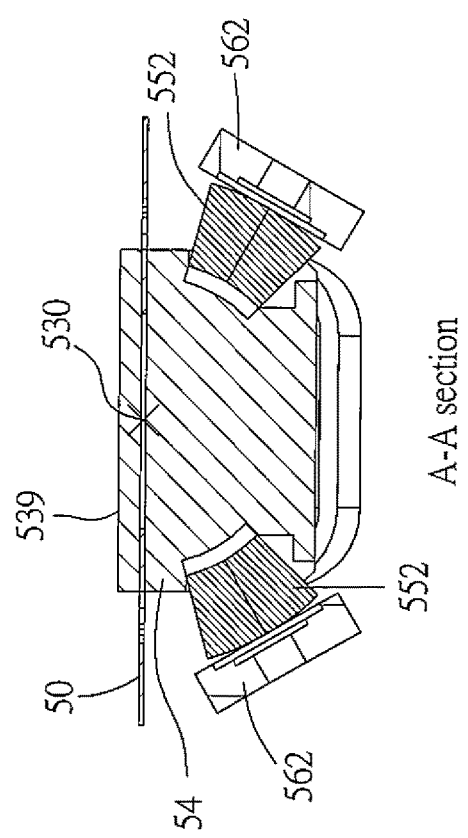
FIG. 20 is an A-A sectional view of FIG. 19.

Please refer to FIGS. 18-20, which illustrate another preferred embodiment of the rotating unit of the image-capturing device of the invention, which comprises arc magnets and arc coils. Wherein, FIG. 18 is an exploded perspective view of an embodiment of the rotating unit comprising an arc magnet and an arc coil of the image-capturing device of the invention; FIG. 19 is a top assembling view of the rotating unit of the invention as shown in FIG. 18; and FIG. 20 is an A-A sectional view of FIG. 19.

As shown in FIGS. 18-20, in this embodiment, the twin-axial rotating element 50 is formed as a rectangular thin spring plate having four lateral sides and further including an outer frame portion 51, a middle frame portion 52, and an inner plate portion 53. The outer frame portion 51 is divided into two elongated strips located at two opposite sides of the twin-axial rotating element 50. The inner plate portion 53 has a plane facing the optical path, and the first axial direction (R1, not shown in these figures), the second axial direction (R2, not shown in these figures) and a virtual center 530 located at the intersection of these two axial directions are defined on this plane. The middle frame portion 52 circles around a periphery of the inner plate portion 53. At least one first through trench 531 is formed between the middle frame portion 52 and the inner plate portion 53 for separating the middle frame portion 52 and the inner plate portion 53, and two first connection ribs 532 aligned in the first axial direction (R1) are provided between the middle frame portion 52 and the inner plate portion 53 for connecting the middle frame portion 52 and the inner plate portion 53. As shown, the two first connection ribs 532 are located to two opposing sides of the inner plate portion 53 in a manner of dividing the at least one first through trench 531 into two U-shape first through trenches 531. By providing these two first connection ribs 532, the inner plate portion 53 and the middle frame portion 52 are thus connected. In addition, the outer frame portion 51 is located at an outer periphery of the middle frame portion 52. At least one second through trench 521 is formed between the outer frame portion 51 and the middle frame portion 52 for separating the outer frame portion 51 and the middle frame portion 52, and two second connection ribs 522 aligned in the second axial direction (R2) are provided between the outer frame portion 51 and the middle frame portion 52 for connecting the outer frame portion 51 and the middle frame portion 52. By providing these two second connection ribs 522, the middle frame portion 52 and the outer frame portion 51 are thus connected. Namely, these two first connection ribs 532 and the two second connection ribs 522 are arranged into two pairs located to respective opposing sides of the rectangular thin spring plate, such that, by providing elasticity of the thin spring plate, the inner plate portion 53 can undergo a limited pivotal motion with respect to the outer frame portion 51 about a line passing through the two first connection ribs 532 (i.e. the first axial direction), and the inner plate portion 53 can undergo another limited pivotal motion with respect to the outer frame portion 51 about a line passing through the two second connection ribs 522 (i.e. the second axial direction). Upon such an arrangement, the design goal of the twin-axial rotating element 50 to provide twin-axial pivotal motions can be achieved. Hence, by providing trenching on the thin spring plate so as to form a multi-frame structure, the twin-axial rotating element 50 as a unique piece with a simple structure, a small size and a lower cost can be thus obtained. Moreover, in this embodiment, each one of the connection ribs 522,532 is not merely a short straight line segment only, in contrast, each one of the connection ribs 522,532 is formed as a curved, elongated and symmetrical-shaped strip structure. As a result, not only the flexibility of each connection rib 522,532 can be increased, so as to vastly increase the maximum angle of rotation to a value greater than 15 degrees or even more; in addition, the strength of such novel structure of the connection rib 522,532 is also increased, such that the connection rib 522,532 won't be broken nor permanently deformed when the connection rib 522,532 is bearing large angle of rotation.

As shown from FIG. 18 to FIG. 20, the rotating unit comprising arc magnets and arc coils is connected with the twin-axial rotating element 50 and is to drive the twin-axial rotating element 50 to undergo respective relatively pivotal motions in a relatively large angle about the first axial direction (R1) and the second axial direction (R2), for example, but not limited to, an angle greater than 3 degree or even ±15 degrees, or even higher. In this embodiment, the rotating unit is an electromagnetic driving module including at least an inner carrier structure 54, an outer carrier structure (not shown in FIGS. 18-20), at least one first arc magnet 551, at least one second arc magnet 552, at least one first arc coil 561, and at least one second arc coil 562.

In this embodiment, the so called "arc" magnet 551,552 means that, an outer side-surface of each one of these arc magnets 551,552 facing its corresponding coil 561,562 is a curved surface, and the curved surface is a portion of a spheral surface which has a center located right at the virtual center 530 of the inner frame portion 53. In the mean time, the so called "arc" coils 561,562 means that, an inner side-surface of each one of these arc coils 561,562 facing its corresponding magnet is a curved surface, and the curved surface is a portion of another spheral surface which has a center also located right at the virtual center 530 of the inner frame portion 53. Therefore, when at least one of these arc coils 561,562 is supplied with electric powers, the powered arc coils 561,562 work in coordination with the arc magnets 551,552 to generate magnetic forces, in order to push the inner carrier structure 54 together with the inner plate portion 53 and the light-reflecting member 539 to pivot (rotate) about either the first connecting ribs 532 or the second connecting ribs 522, or both. Even when a large angle of rotation is performed, the gaps between the arc magnets 551,552 and their corresponding arc coils 561,562 will all remain the same. The interference caused by shrinking gaps and the decayed magnetic pushing force caused by increasing gaps are both avoided in this embodiment. In this embodiment, each one of the arc coils 561,562 is composed of a plurality of concentric wire-circles 5611,5612,5613. The "arc" inner side-surface of each one of the arc coils 561,562 is achieved by making its wire-circles 5611,5612, 5613 with different height (thickness). That is, a wire-circle 5611 nearer to the center will be located lower (thinner), while another wire-circle 5613 farther away from the center will be located higher (thicker), such that, an arc coil 561,562 having a structure with thinner center and thicker periphery can be achieved.

The inner carrier structure 54 is engaged on a bottom of the inner plate portion 53 so as to co-move with the inner plate portion 53, and the outer carrier structure (not shown in FIGS. 18-20) is fixed with a bottom of the outer frame portion 51.

The first arc magnets 552 are mounted at the inner carrier structure 54, while the first arc coils 561 are located at the outer carrier structure. In this embodiment, two first arc magnets 552 are mounted individually to two opposing sides of the inner carrier structure 54 by closing to the two second connection ribs 522, and two first arc coils 562 are mounted individually to two opposing sides of the outer carrier structure by closing to the two second connection ribs 522 and at locations corresponding to the two first arc magnets 552. By energizing the two first arc coils 562, a corresponding electromagnetic force can be produced to push the two first arc magnets 552 and the inner plate portion 53 on the inner carrier structure 54 to undergo a pivotal motion about the first axial direction (R1).

The second arc magnets 551 are mounted at the inner carrier structure 54, while the second arc coils 561 are located at the outer carrier structure. In this embodiment, two second arc magnets 551 are mounted individually to two opposing sides of the inner carrier structure 54 by closing to the two first connection ribs 532, and two second arc coils 561 are mounted individually to two opposing sides of the outer carrier structure by closing to the two first connection ribs 532 and at locations corresponding to the two second arc magnets 551. By energizing the two second arc coils 561, a corresponding electromagnetic force can be produced to push the two second arc magnets 551 and the the inner plate portion 53 on the inner carrier structure 54 to undergo another pivotal motion about the second axial direction (R2).

The inner carrier structure 54 is a block structure having a wider top and narrower bottom. The inner carrier structure 54 has a rectangular first contact portion 541 connecting the bottom of the inner plate portion 53 and four first side surfaces 542,543 extending from corresponding lateral sides of the rectangular first contact portion 541 in respective directions away of the inner plate portion 53. Each one of the first side surfaces 542,543 is a curved surface. Further, on each of the curved first side surfaces 542,543, a first accommodation base 544,545 is included. In this embodiment, the first arc magnets 552 are respectively mounted into the first accommodation bases 545 of the first side surfaces 543 of the inner carrier structure 54. The second arc magnets 551 are respectively mounted into the first accommodation base 544 of the first side surface 542 of the inner carrier structure 54. By providing the aforesaid specific inner carrier structure 54 having four curved side surfaces and further to mount the arc magnets 551,552 and the arc coils 561,562, the electromagnetic rotating unit featured in simple structuring, easy assembling, small voluming and lower costing can be thus mounted easily into a typical optical system such as a digital camera or digital recorder.

According to the above discussions, it is understood that, in comparison with an electromagnetic driving mechanism comprising flat magnets and flat coils, the electric-magnetic driving rotating unit as illustrated in FIGS. 18-20 uses arc magnets to work with arc coils and has at least the following advantages: (1) can provide larger angle of rotation without the risk of interference; (2) can avoid decay of electric-magnetic force caused by the variation of gap between the magnet and coil during the rotations; and (3) when such feature is combined with the optical anti-shake function, better anti-shake function can be acquired because larger angle of rotation can be performed for compensating the deviations caused by shakings. As a result, the electric-magnetic driving rotating unit using arc magnets to work with arc coils as illustrated in FIGS. 18-20 is more suitable to be utilized in the image-capturing device and the image-capturing method of the invention.

While the present invention has been particularly shown and described with reference to a preferred embodiment, it will be understood by those skilled in the art that various changes in form and detail may be without departing from the spirit and scope of the present invention.

What is claimed is:

1. An image-capturing device, comprising:
a light-reflecting member for redirecting at least two foreign light images at different photographic areas to an optical path;
an image-capturing unit, located on the optical path to receive the light image and further to transform the light image into a corresponding electric signal readable to a control unit;
a lens module, located on the optical path at a position between the light- reflecting member and the image-capturing unit, to image the light image from the light-reflecting member onto the image-capturing unit;
a twin-axial rotating element, said light-reflecting member being disposed at said twin-axial rotating element, the twin-axial rotating element is able to undergo limited pivotal motions about a first axial direction and a second axial direction perpendicular to the first axial direction: the first axial direction intersecting the optical path by approximately forty-five degrees, and the second axial direction being approximately perpendicular to the optical path;
a rotating unit, engaged with the twin-axial rotating element to drive the twin-axial rotating element together with the light-reflecting member to undergo the limited pivotal motions about the first axial direction and the second axial direction so as to allow at least two different foreign light images at different photographic areas to be redirected to the optical path by the light-reflecting member and then imaged onto the image-capturing unit, such that the image-capturing unit is able to capture the at least two different foreign light images in the different photographic areas without moving the image-capturing unit and the lens module;
the control unit, electrically coupled with the image-capturing unit and the rotating unit, to control the rotating unit and the image-capturing unit and to integrate the at least two different light images imaged on the image-capturing unit to further produce a combined image; and
a shutter button pressable by a user;
wherein, when said shutter button is pressed by the user, said image capturing device proceeding with the following Steps (b1) to (b6);
Step (b1): the control unit controlling the rotating unit to drive the light-reflecting member to rotate to a first position and to control the image-capturing unit to capture a first light image; said first light image having four corners;
Step (b2): without moving the image-capturing unit and the lens module, the control unit controlling the rotating unit to drive the light-reflecting member to rotate to a second position about both the first axial direction and the second axial direction and to control the image-capturing unit to capture a second light image; wherein the first light image and the second light image are partly overlapped to have a first duplicated image at a first corner part of the first light image;
Step (b3): without moving the image-capturing unit and the lens module, the control unit controlling the rotating unit to drive the light-reflecting member to rotate to a third position about both the first axial direction and the second axial direction and to control the image-capturing unit to capture a third light image; wherein the first light image and the third light image are partly overlapped to have a second duplicated image at a second corner part of the first light image;
Step (b4): without moving the image-capturing unit and the lens module, the control unit controlling the rotating unit to drive the light-reflecting member to rotate to a fourth position about both the first axial direction and the second axial direction and to control the image-capturing unit to capture a fourth light image; wherein the first light image and the fourth light image are partly overlapped to have a third duplicated image at a third corner part of the first light image;
Step (b5): without moving the image-capturing unit and the lens module, the control unit controlling the rotating unit to drive the light-reflecting member to rotate to a fifth position about both the first axial direction and the second axial direction and to control the image-capturing unit to capture a fifth light image; wherein the first light image and the fourth light image are partly overlapped to have a fourth duplicated image at a fourth corner part of the first light image; Step (b6): the control unit basing on the first duplicated image of the first light image and the second light image, the second duplicated image of the first light image and the third light image, the third duplicated image of the first light image and the fourth light image, and the fourth duplicated image of the first light image and the fifth light image, to integrate the first light image, the second light image, the third light image, the fourth light image and the fifth light image into a single combined image; wherein the first light image, the second light image, the third light image, the fourth light image and the fifth light image have the same length, width and pixel value, and the length, width and pixel value of the combined image are all larger than that of the first light image.

2. The image-capturing device of claim 1, further including a switch mechanism engaged with the rotating unit, wherein the switch mechanism drives the rotating unit to rotate about a third axial direction so as to drive simultaneously the rotating unit associated with the light-reflecting member to undergo a rotation about the third axial direction; wherein the second axial direction is perpendicular to the third axial direction, and the first axial direction intersects the third axial direction by a 45-degree angle.

3. An image-capturing method, comprising:

Step (a): providing an image capturing device, said image capturing device comprising:

a light-reflecting member for redirecting at least two foreign light images at different photographic areas to an optical path;

an image-capturing unit, located on the optical path to receive the light image and further to transform the light image into a corresponding electric signal readable to a control unit;

a lens module, located on the optical path at a position between the light-reflecting member and the image-capturing unit, to image the light image from the light-reflecting member onto the image-capturing unit;

a twin-axial rotating element, said light-reflecting member being disposed at said twin-axial rotating element, the twin-axial rotating element is able to undergo limited pivotal motions about a first axial direction and a second axial direction perpendicular to the first axial direction;

the first axial direction intersecting the optical path by approximately forty-five degrees, and the second axial direction being approximately perpendicular to the optical path;

a rotating unit, engaged with the twin-axial rotating element to drive the twin-axial rotating element together with the light-reflecting member to undergo the limited pivotal motions about the first axial direction and the second axial direction so as to allow at least two different foreign light images at different photographic areas to be redirected to the optical path by the light-reflecting member and then imaged onto the image-capturing unit, such that the image-capturing unit is able to capture the at least two different foreign light images in the different photographic areas without moving the image-capturing unit and the lens module;

the control unit, electrically coupled with the image-capturing unit and the rotating unit, to control the rotating unit and the image-capturing unit and to integrate the at least two different light images imaged on the image-capturing unit to further produce a combined image; and a shutter button pressable by a user;

Step (b): upon said shutter button being pressed by the user, said image capturing device proceeding with the following Steps (b1) to (b6);

Step (b1): the control unit controlling the rotating unit to drive the light- reflecting member to rotate to a first position and to control the image-capturing unit to capture a first light image;

said first light image having four corners;

Step (b2): without moving the image-capturing unit and the lens module, the control unit controlling the rotating unit to drive the light-reflecting member to rotate to a second position about both the first axial direction and the second axial direction and to control the image-capturing unit to capture a second light image; wherein the first light image and the second light image are partly overlapped to have a first duplicated image at a first corner part of the first light image;

Step (b3): without moving the image-capturing unit and the lens module, the control unit controlling the rotating unit to drive the light-reflecting member to rotate to a third position about both the first axial direction and the second axial direction and to control the image-capturing unit to capture a third light image; wherein the first light image and the third light image are partly overlapped to have a second duplicated image at a second corner part of the first light image;

Step (b4): without moving the image-capturing unit and the lens module, the control unit controlling the rotating unit to drive the light-reflecting member to rotate to a fourth position about both the first axial direction and the second axial direction and to control the image-capturing unit to capture a fourth light image; wherein the first light image and the fourth light image are partly overlapped to have a third duplicated image at a third corner part of the first light image;

Step (b5): without moving the image-capturing unit and the lens module, the control unit controlling the rotating unit to drive the light-reflecting member to rotate to a fifth position about both the first axial direction and the second axial direction and to control the image-capturing unit to capture a fifth light image; wherein the first light image and the fourth light image are partly overlapped to have a fourth duplicated image at a fourth corner part of the first light image;

Step (b6): the control unit basing on the first duplicated image of the first light image and the second light image, the second duplicated image of the first light image and the third light image, the third duplicated image of the first light image and the fourth light image, and the fourth duplicated image of the first light image and the fifth light image, to integrate the first light image, the second light image, the third light image, the fourth light image and the fifth light image into a single combined image;

wherein the first light image, the second light image, the third light image, the fourth light image and the fifth light image have the same length, width and pixel value, and at least one of the length, width and pixel value of the combined image are all larger than that of the first light image.

4. The image-capturing method of claim 3, further including a switch mechanism engaged with the rotating unit, wherein the switch mechanism drives the rotating unit to rotate about a third axial direction so as to drive simultaneously the rotating unit associated with the light-reflecting member to undergo a rotation about the third axial direction; wherein the second axial direction is perpendicular to the third axial direction, and the first axial direction intersects the third axial direction by a 45-degree angle.

* * * * *